(12) United States Patent
Ghoshal et al.

(10) Patent No.: US 7,131,286 B2
(45) Date of Patent: Nov. 7, 2006

(54) COOLING OF ELECTRONICS BY ELECTRICALLY CONDUCTING FLUIDS

(75) Inventors: Uttam Ghoshal, Austin, TX (US); Andrew Carl Miner, Austin, TX (US)

(73) Assignee: NanoCoolers, Inc., Austin, TX (US)

( * ) Notice: Subject to any disclaimer, the term of this patent is extended or adjusted under 35 U.S.C. 154(b) by 226 days.

(21) Appl. No.: 10/768,767

(22) Filed: Jan. 30, 2004

(65) Prior Publication Data

US 2004/0182088 A1 Sep. 23, 2004

Related U.S. Application Data

(63) Continuation-in-part of application No. 10/313,696, filed on Dec. 6, 2002, now Pat. No. 6,708,501.

(51) Int. Cl.
*F28D 15/00* (2006.01)
(52) U.S. Cl. .................. 62/259.2; 62/3.7
(58) Field of Classification Search ............. 62/3.7, 62/259.2; 165/104.19, 104.28
See application file for complete search history.

(56) References Cited

U.S. PATENT DOCUMENTS

| | | | |
|---|---|---|---|
| 3,654,528 | A | 4/1972 | Barkan |
| 4,065,936 | A | 1/1978 | Fenton |
| 4,177,015 | A | 12/1979 | Davidson |
| 4,688,147 | A | 8/1987 | Ono |
| 5,184,211 | A | 2/1993 | Fox |
| 5,943,211 | A | 8/1999 | Havey et al. |
| 5,993,164 | A | 11/1999 | Diaz |
| 6,021,844 | A | 2/2000 | Batchelder |
| 6,065,293 | A | 5/2000 | Ghoshal |
| 6,105,381 | A | 8/2000 | Ghoshal |
| 6,119,463 | A | 9/2000 | Bell |
| 6,161,388 | A | 12/2000 | Ghoshal |
| 6,175,495 | B1 | 1/2001 | Batchelder |
| 6,222,113 | B1 | 4/2001 | Ghoshal |
| 6,256,996 | B1 | 7/2001 | Ghoshal |
| 6,266,962 | B1 | 7/2001 | Ghoshal |
| 6,282,907 | B1 | 9/2001 | Ghoshal |
| 6,384,312 | B1 | 5/2002 | Ghoshal |
| 6,452,740 | B1 | 9/2002 | Ghoshal |

(Continued)

FOREIGN PATENT DOCUMENTS

JP           360004244  A         1/1985

(Continued)

OTHER PUBLICATIONS

V. Zakordonets and G. Loginov, "Thermoelectric figure of merit of monopolar semiconductors with finite dimensions," *Semiconductors*, vol. 31, pp. 265-267, Mar. 1997.

(Continued)

*Primary Examiner*—Melvin Jones
(74) *Attorney, Agent, or Firm*—Zagorin O'Brien Graham LLP

(57) ABSTRACT

Apparatus to provide effective removal of heat from a high power density device. The apparatus has a heat spreader and a heat sink structure. The heat spreader is divided into one or more chambers. Electromagnetic pumps are placed inside each chamber in a configuration that facilitates easy circulation of liquid metal inside the chamber. The liquid metal preferably is an alloy of gallium and indium that has high electrical conductivity and high thermal conductivity. The liquid metal carries heat from a localized area (over the high power density device) and distributes it over the entire spreader. This results in a uniform distribution of heat on the base of the heat sink structure and hence effective removal of heat by the heat sink structure.

17 Claims, 18 Drawing Sheets

U.S. PATENT DOCUMENTS

| | | |
|---|---|---|
| 6,474,074 B1 | 11/2002 | Ghoshal |
| 6,588,217 B1 | 7/2003 | Ghoshal |
| 6,597,544 B1 | 7/2003 | Ghoshal |
| 6,598,403 B1 | 7/2003 | Ghoshal |
| 6,598,405 B1 | 7/2003 | Bell |
| 6,625,866 B1 | 8/2003 | Bell |
| 6,613,602 B1 | 9/2003 | Cooper et al. |
| 6,614,109 B1 | 9/2003 | Cordes et al. |
| 6,658,861 B1 | 12/2003 | Ghoshal et al. |
| 6,672,076 B1 | 1/2004 | Bell |
| 6,708,501 B1 * | 3/2004 | Ghoshal et al. ............... 62/3.7 |
| 6,712,258 B1 | 3/2004 | Ghoshal |
| 6,766,817 B1 | 7/2004 | da Silva |
| 2002/0075643 A1 | 6/2002 | Nakagawa et al. |
| 2004/0031514 A1 | 2/2004 | Bell |

FOREIGN PATENT DOCUMENTS

| | | |
|---|---|---|
| JP | 06188682 A | 7/1994 |

OTHER PUBLICATIONS

D.M. Rowe (ed.), *CRC Handbook of Thermoelectrics*, CRC Press (New York), 1995, pp. 479-488.

Adrian Bejan (ed.), *Advanced Engineering Thermodynamics*, 2nd Edition, John Wiley & Sons, Inc. (New York), 1997, pp. 675-682.

Michael Coey and Denis Weaire, "Magnets, Markets and Magic Cylinders", The Industrial Physicist, vol. 4, No. 3, Sep. 1998, pp. 34-36.

Tellurex Corporation, "Frequently Asked Questions about Thermoelectric Power Generation," http://www.tellurex.com, © 2002, printed Dec. 1, 2004.

* cited by examiner

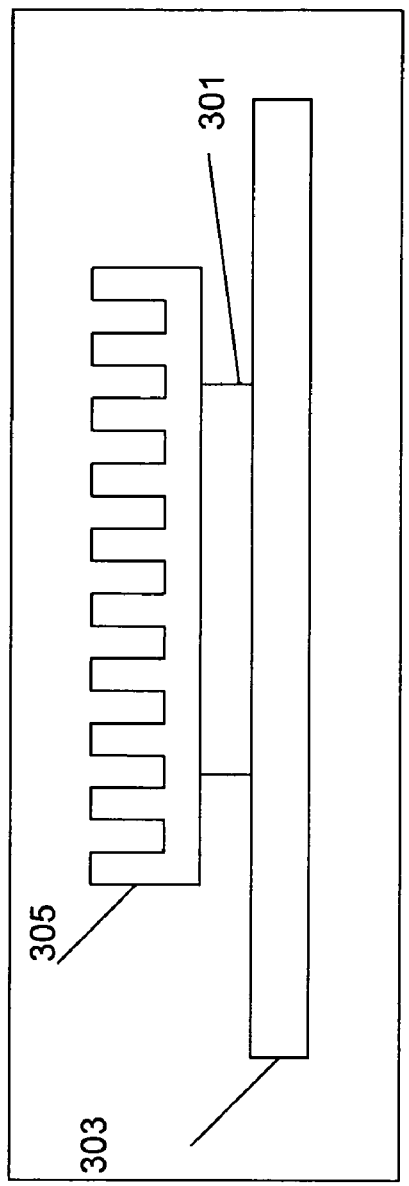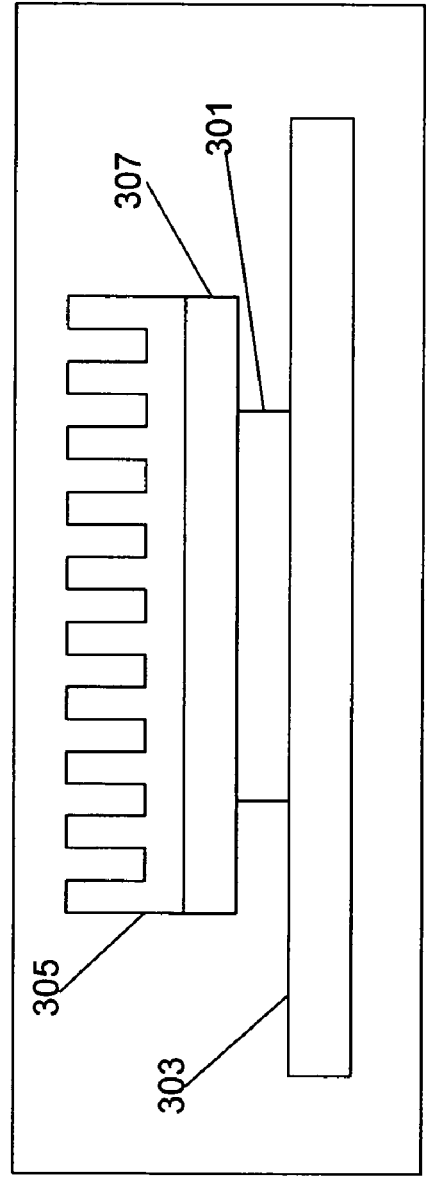
FIG. 3A
*Prior Art*
FIG. 3B
*Prior Art*

COOLING OF ELECTRONICS BY ELECTRICALLY CONDUCTING FLUIDS

RELATED APPLICATIONS

This application is a CIP of U.S. patent application Ser. No. 10/313696 filed on Dec. 06, 2002 now U.S. Pat. No. 6,708,501 whose priority is claimed. The above-named patent application is assigned to the same entity, and is incorporated herein by reference.

BACKGROUND

The present invention relates to a system for dissipating heat from a high power density device (HPDD). More specifically, the present invention relates to a heat spreader that helps in effective dissipation of heat from the HPDD.

Electronic devices such as central processing units, graphic-processing units, laser diodes etc. generate a lot of heat during operation. In case the generated heat is not dissipated properly from high power density devices, this may lead to temperature buildup in these devices. The buildup of temperature can adversely affect the performance of these devices. For example, excessive temperature buildup may lead to malfunctioning or breakdown of the devices. So, it is important to remove the generated heat in order to maintain normal operating temperatures of these devices.

The heat generated by HPDD is removed by transferring the heat to the ambient atmosphere. As heat generated by HPDD increases, more heat has to be transferred to maintain the operating temperature of the HPDD. The transfer of heat from a HPDD to the atmosphere faces thermal resistance. In order to transfer more heat, this thermal resistance has to be reduced. One way to reduce thermal resistance is to increase the effective surface area of the hot device, for this purpose a finned heat sink structure is sometimes used. This finned heat sink structure increases the effective surface area for transfer of heat from the HPDD, thereby reducing the thermal resistance between a HPDD and atmosphere.

FIG. 1 shows a typical finned heat sink structure 101 mounted on HPDD 103. The HPDD is mounted on mounting board 105. Heat generated by HPDD 103 is transferred to finned heat sink structure 101. This finned heat sink structure in turn dissipates the heat to the atmosphere. The surface area of the finned heat sink structure is much larger than that of the HPDD. This increases the effective surface area for transfer of heat from the HPDD leading to reduced thermal resistance between the HPDD and the atmosphere. The reduced thermal resistance results in an increase in the rate of dissipation of heat to the atmosphere. Heat is transferred from the finned heat sink structure 101 to the atmosphere by natural convection, or by forced convection with the use of a fan.

However, the material used to construct finned heat sink structures has inherent resistance to the flow of heat. This leads to uneven distribution of temperature at base of the finned heat sink structure. This reduces the effectiveness of the finned heat sink structure in dissipating the heat.

FIG. 2A shows a finned heat sink structure 201 with uneven temperature distribution at the base of the structure. Arrows of differing lengths show the flow of heat in the finned heat sink structure. The shorter lengths of arrows at the outer fins depict less flow of heat as compared to the flow of heat in the inner fins (depicted by large arrows). The outer fins of finned heat sink structure 201 are not as effective in dissipating heat as the inner fins. This is due to an uneven temperature distribution at the base. FIG. 2B shows a finned heat sink structure 205 with uniform temperature at the base of the structure. The same lengths of arrows at the outer and inner fins depict uniform flow of heat in the fins. Thus, unlike finned heat sink structure 201 of FIG. 2A, the outer fins of finned heat sink structure 205 are as effective in dissipating heat, as its inner fins.

Hence, in order to increase the effectiveness of the finned heat sink structure heat needs to be uniformly distributed at the base of the structure. An important way for uniformly distributing heat at the base of the finned heat sink structure is by using a device called a heat spreader. The heat spreader is placed between HPDD and finned heat sink structure and spreads heat uniformly at the base of the structure.

FIG. 3 depicts the use of heat spreaders for uniform distribution of heat. FIG. 3A shows a HPDD 301 on a mounting board 303. A Finned heat sink structure 305 is placed in contact with HPDD 301. Heat is removed by conduction from HPDD 301 to finned heat sink structure 305. Heat is thereafter dissipated by finned heat sink structure 305 to the ambient atmosphere.

FIG. 3B shows a heat spreader 307 placed between HPDD 301 and finned heat sink structure 305. Heat spreader 307 increases transfer of heat between HPDD 301 and finned heat sink structure 305 by evenly distributing heat at the base of finned sink structure 305.

Heat spreaders are usually made of materials with low thermal resistance. Examples of such materials include copper or aluminum. Lightweight materials having high thermal conductivity such as graphite sheets and CVD (chemical vapor deposition) diamond thin film are also used for making heat spreaders. Typically, these high thermal conducting materials are costly and do not increase performance of the heat spreader substantially more than aluminum or copper heat spreaders.

Head spreaders may also be based on vapor chambers. A vapor chamber based heat spreader involves the vaporization and condensation of the liquid filling it. This heat spreader has a vacuum vessel with a saturated wick structure lining the inside walls. As heat is applied to the base of the heat spreader, the working fluid at the base immediately vaporizes, and the vapor rushes to fill the vacuum. Wherever the vapor comes into contact with cooler wall surface it condenses, releasing its latent heat of vaporization. The condensed liquid returns to the base via capillary action in the wick structure.

FIG. 4 shows a heat spreader 401 based on a vapor chamber. Heat spreader 401 is placed between HPDD 403 and finned heat sink structure 405. Heat spreader 401 has two surfaces, a surface 407 in contact with the finned heat sink structure 405 and a surface 409 in contact with HPDD 403. There is a lining 411 inside the heat spreader. Liquid on surface 409 absorbs heat from HPDD 403, evaporates and fills the vacuum in heat spreader 401. When it comes in contact with surface 407, it transfers heat to finned heat sink structure 405, condenses and moves back to surface 409 due to gravity or the capillary effect. The capillary action enables the performance of vapor chamber based heat spreader to be less dependent on the device's orientation with respect to gravity Also, thermal resistance associated with the vapor spreading is negligible.

However, maximum heat transfer in a vapor chamber based heat spreader is limited by vapor/liquid nucleation properties. Heat transfer is also limited by the presence of interface resistances such as that between metal surface and liquid layer and between metal surface and vapor.

From the above discussion, it is evident that presently available heat spreaders suffer from various limitations that limit the effectiveness of these heat spreaders. These limitations lead to higher device operating temperatures and decreased performance of HPDD. Thus, there is a need for heat spreaders that can effectively remove the heat from high power density devices.

SUMMARY

It is an object of the invention to provide a system for effective removal of heat from high power density devices.

It is another object of the invention to provide a heat spreader that uses electromagnetic pumps for circulating liquid metal inside the heat spreader for uniform distribution of heat throughout the heat spreader.

It is another object of the invention to provide a heat spreader that uses liquid metals like gallium indium alloy, bismuth, indium, gallium, mercury and sodium potassium eutectic alloy to provide uniform distribution of heat throughout the heat spreader.

It is yet another object of the invention to provide heat spreaders of different shapes and sizes depending on form factor limitations.

It is yet another object of the invention to provide heat spreaders that employ thermoelectric generators to power the electromagnetic pumps thereby doing away with the need of external power sources.

It is further object of the invention to provide electromagnetic pumps that use polymers or refractory metals as the tube material and gallium indium alloy as the liquid metal.

The invention provides a system for the effective removal of heat from a high power density device. The system in accordance with the invention has a heat sink structure mounted on a heat spreader. The heat spreader has electromagnetic pumps for circulating liquid metal throughout the heat spreader. Circulation of liquid metal throughout the spreader allows for uniform distribution of heat in the spreader and at the base of the heat sink structure. This uniform distribution increases the transfer of heat from the high power density device to the heat sink structure and consequently from the heat sink structure to the atmosphere.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which:

FIG. 3A shows a high power density device on mounting board with heat sink structure placed in contact with a high power density device;

FIG. 3B shows a heat spreader placed between a high power density device and finned heat sink structure;

DESCRIPTION OF THE PREFERRED EMBODIMENTS

Figure 1:
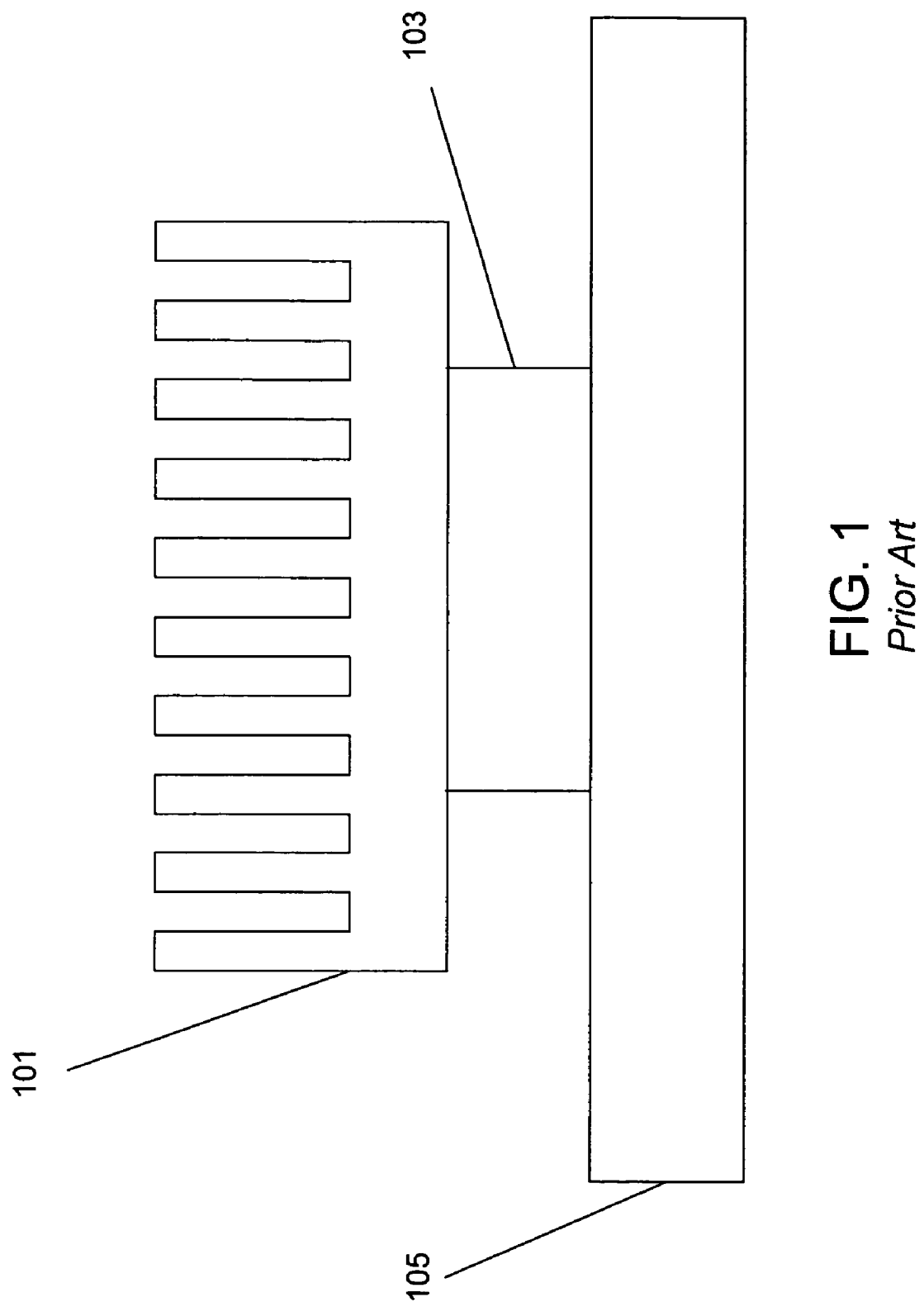
FIG. 1 shows a finned heat sink structure mounted on a High Power Density Device (HPDD)
Figure 2A:
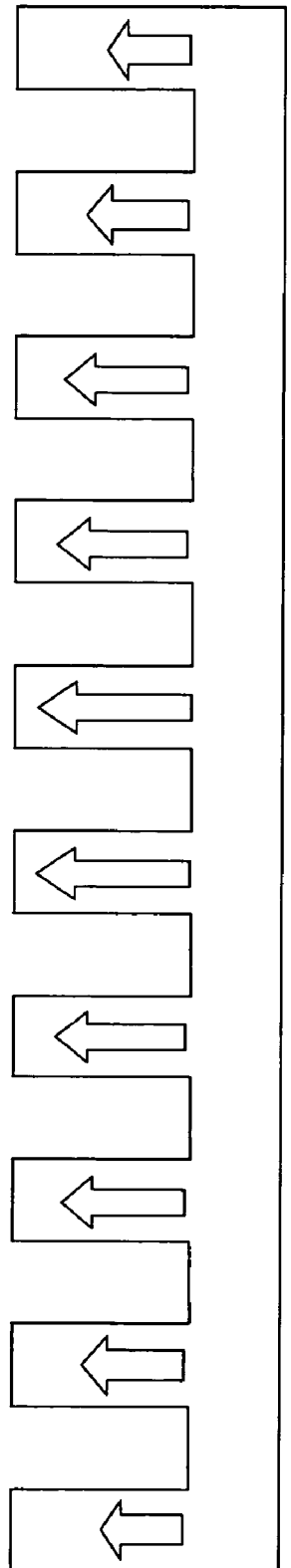
FIG. 2A shows a finned heat sink structure with uneven temperature distribution at the base of the structure.
Figure 2B:
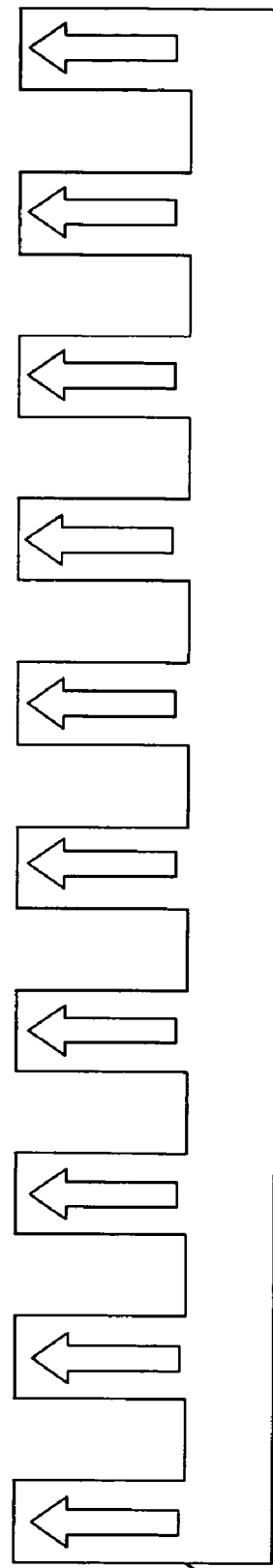
FIG. 2B shows a finned heat sink structure with uniform temperature at the base of the structure.
Figure 4:
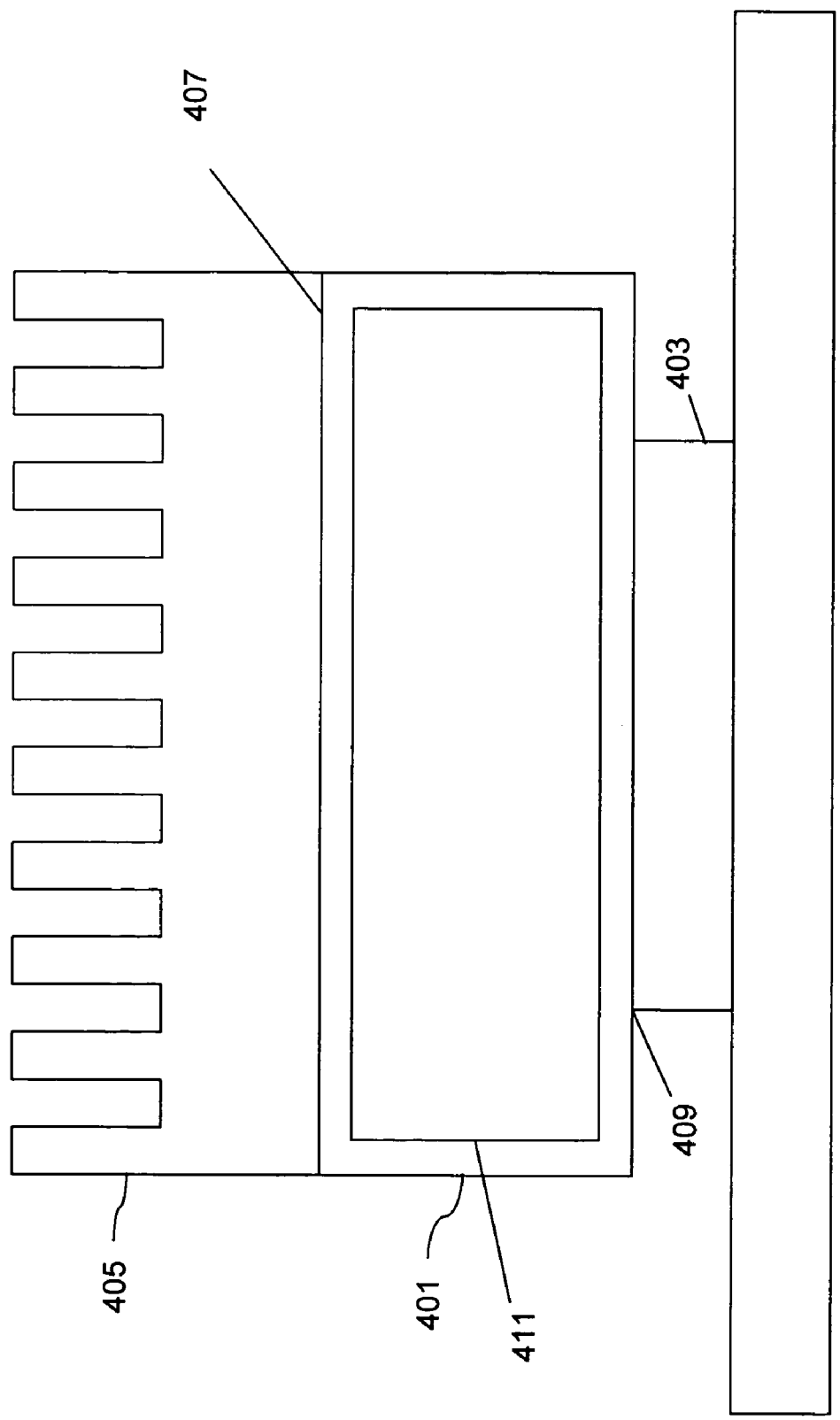
FIG. 4 shows a heat spreader based on a vapor chamber.
Figure 5:
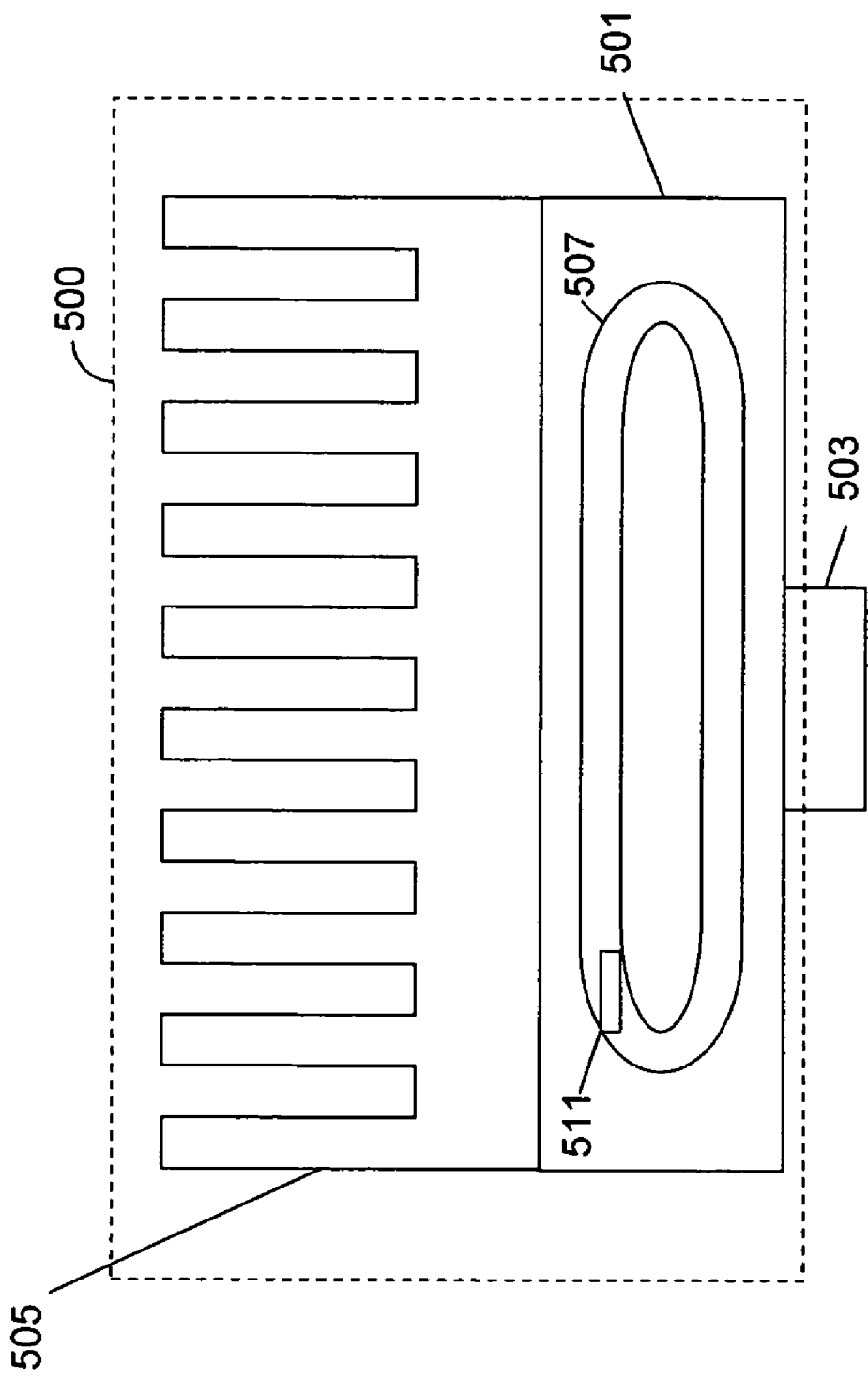
FIG. 5 is a schematic diagram of a system for dissipating heat from high power density devices in accordance with a preferred embodiment of the present invention.

FIG. 5 shows a system 500 for removal of heat from a high power density device. System 500 comprises a heat spreader 501 and a finned heat sink structure 505. System 500 is positioned above a high power density device 503. Heat spreader 501 is constructed using a low thermal resistance material; examples of such material include aluminum or copper. Heat spreader 501 spreads the heat generated by high power density device 503 over its large surface area. Heat is transferred from heat spreader 501 to finned heat sink structure 505 placed in contact with heat spreader 501. Finned heat sink structure 505 is also constructed of a low thermal resistance material. Finned heat sink structure 505 transfers the heat to the atmosphere by natural convection, or by forced convection with the use of a fan.

Heat spreader 501 has a chamber 507 containing liquid metal. One or more electromagnetic pumps 511 are placed inside chamber 507. Electromagnetic pump 511 circulates the liquid metal inside chamber 507. Thus, liquid metal near high power density device 503 absorbs heat, and spreads the heat through heat spreader 501, as the liquid metal flows through heat spreader 501. As liquid metal is a good conductor of heat, the heat is also transferred in this case by conduction. Thus, heat spreader 501 combines the use of conduction and convection thereby allowing an increased flow of heat inside heat spreader 501. The flow of heat inside heat spreader 501 allows for increased temperature uniformity within the heat spreader. This increased temperature uniformity within heat spreader 501 increases transfer of heat between high power density device 503 and finned heat sink 505, thereby allowing efficient use of finned heat sink structure 505. In this manner the system provides a highly effective heat spreader 501 by flowing liquid metal in heat spreader 501 using electromagnetic pump 511.

System 500 is not just limited to finned heat sink structures. It will be apparent to one skilled in the art that any heat sink structure (used for transferring heat to the atmosphere) may be employed in the system without departing from the scope of the invention.

The abovementioned system may be used for dissipating heat from a wide variety of devices. For example high power density device 503 of FIG. 5 may be a micro scale device like microelectronic chip, optoelectronic chip, arrays of hot chips, laser diode, light emitting diode (LED), array of LEDs etc. High power density device 503 may also be a central processing unit of a computer, graphical processor unit or a light bulb. In fact heat spreader 501 may also find its application in biological, chemical, or nuclear reactors to dissipate heat generated by these reactors.

Figure 6:
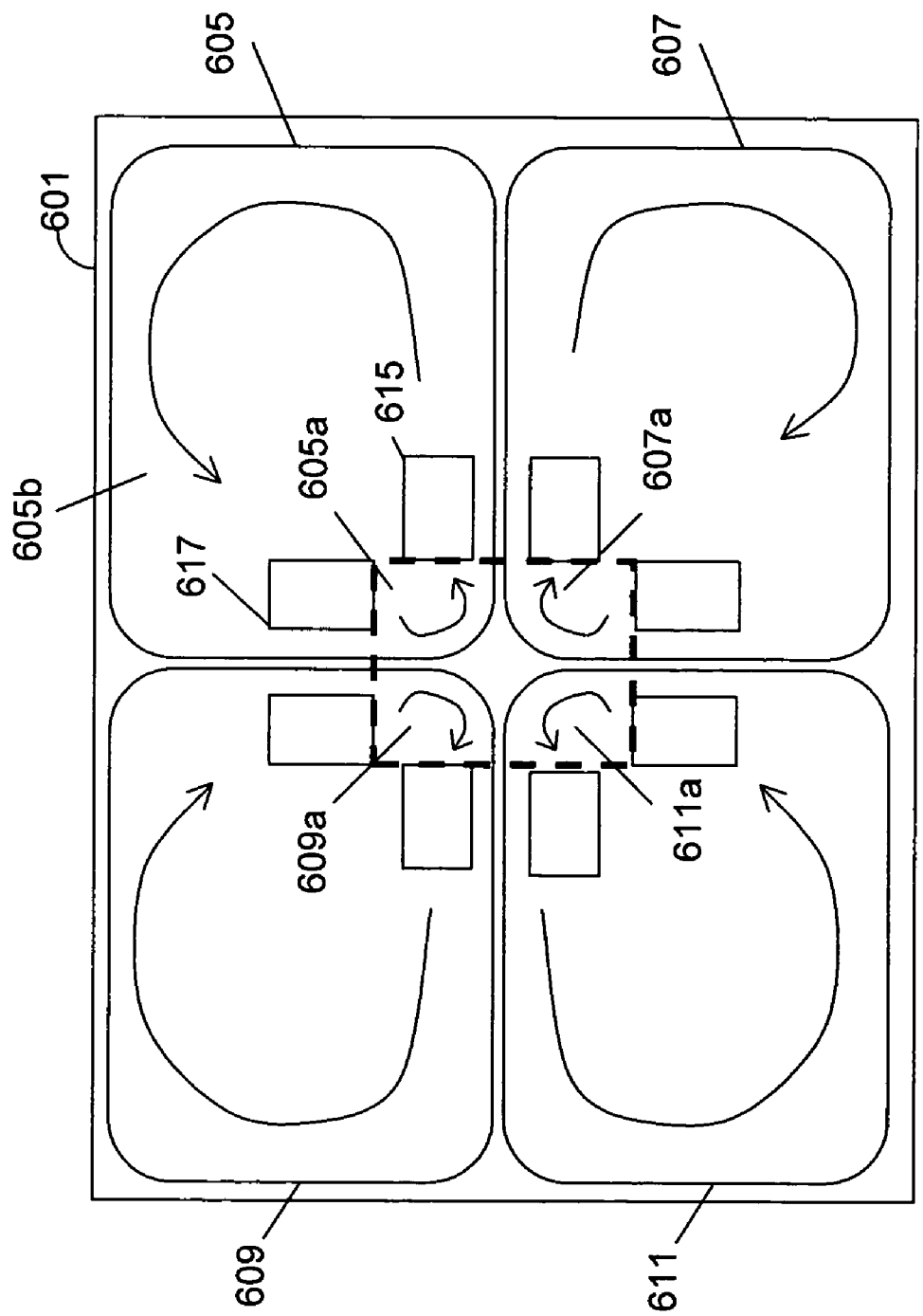
FIG. 6 is a schematic diagram of a heat spreader that uses electromagnetic pumps for circulating liquid metal in accordance with a preferred embodiment of the present invention.

FIG. 6 shows a heat spreader 601 in accordance with the preferred embodiment of the present invention. The cross-section of heat spreader 601 is in the form of a rectangle. Heat spreader 601 is placed over a high power density device (not shown in FIG. 6). Heat spreader 601 has four chambers 605, 607, 609 and 611. The cross-section of each of the chambers is also in the form of a rectangle. Each chamber is filled with liquid metal. Liquid metal in the region directly in contact with the high power density device (comprising of regions 605a, 607a, 609a and 611a) absorbs the generated heat. The working of the heat spreader is illustrated using the example of one of the chambers 605. Chamber 605 has two electromagnetic pumps 615 and 617 for circulating the liquid metal inside chamber 605. The direction of the electric field and the magnetic field in electromagnetic pump 615 is such that electromagnetic pump 615 pushes the hot liquid metal out of hot region 605a. This hot liquid metal circulates in region 605b of chamber 605, thereby spreading the heat. Electromagnetic pump 617 pushes the liquid metal from region 605b back into hot region 605a. The hot liquid metal is thus circulated in chamber 605 in form of a closed loop spreading the heat uniformly throughout chamber 605. The liquid metal develops a steady state mean fluid velocity, as the force exerted by the electromagnetic pump is balanced by viscous drag. In a similar manner liquid metal is circulated in each of the chambers 607, 609 and 611. The heat spreader thus provides a mechanism to uniformly distribute heat leading to effective removal of heat from the high power density device.

Figure 7:
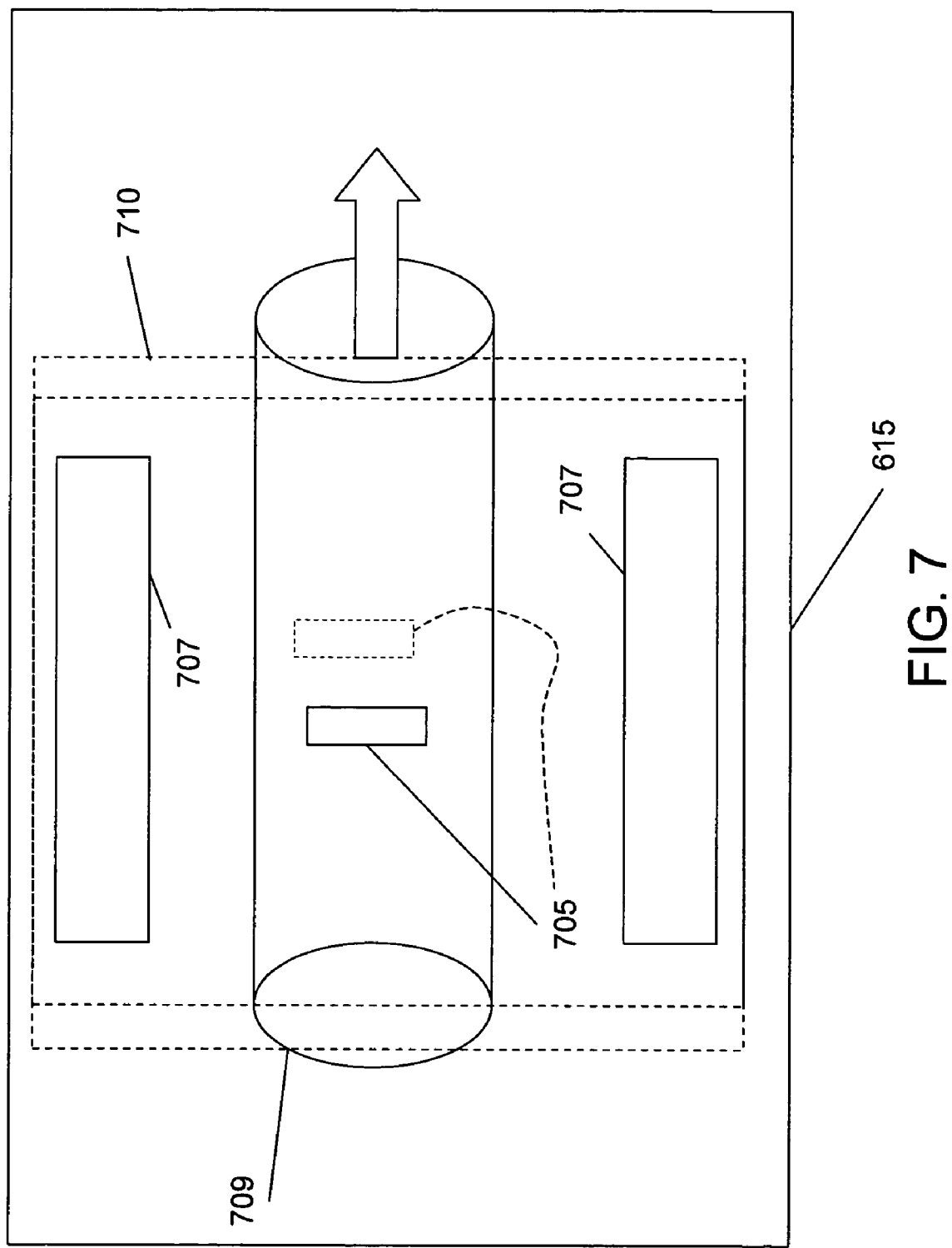
FIG. 7 shows the principle of an electromagnetic pump provided by the heat spreader of the abovementioned system for circulating liquid metal inside the heat spreader.

FIG. 7 shows the principle of electromagnetic pumps employed in the heat spreader for circulating liquid metal. Electromagnetic pump 615 comprises of a pair of electrode plates 705 placed vertically facing each other. A DC (direct current) voltage is applied across the electrode plates. The DC voltage produces an electric field across electrode plates 705. Permanent magnets 707 are arranged facing each other above and below the plane containing electrode plates 705. A tube 709 carries liquid metal. The direction of magnetic field generated by the permanent magnets 707 is perpendicular to the direction of electric field provided by the electrode plates 705. An electromagnetic force acts on the liquid metal causing it to flow in a direction perpendicular to the plane of electric and magnetic fields (as shown by the block arrow in FIG). It would be evident to one skilled in the art that the method of pumping can be implemented in several different ways based on the abovementioned principle. For example, DC electromagnetic pumps (as described above) can be utilized in applications where DC sources are available while induction electromagnetic pumps utilizing polyphase induction coils can be used in cases where physical contact to the liquid metal is undesirable (say, where the liquid metal is corrosive).

In certain applications, the heat spreader may need to be provided with electromagnetic interference (EMI) shielding to shield the high power density device from electromagnetic radiations generated by the pump. These electromagnetic radiations, if not shielded, might adversely affect the performance of the high power density device or its components. Accordingly, either the heat spreader or the high power density device is enclosed within a housing that shields the high power density device. This EMI shielding may be provided using standard methods such as magnetic shields and EMI shielding tapes. As shown in FIG. 7, magnetic shield 710 confines the magnetic field within the pump. The magnetic shield 710 may be made using high magnetic permeability materials such as steel, nickel, alnico, or permandur or other specially processed materials.

In the preferred embodiment, tube 709 is constructed of polymer materials such as Teflon or polyurethane. Teflon has the advantage that it can be easily machined. Alternatively, refractory metals such as tungsten or molybdenum may also be used as the material of construction of tube 709. Ultra-thin anodized aluminum or nickel-coated aluminum or copper can also be used.

In the preferred embodiment, the liquid metal carried by tube 709 is an alloy of gallium and indium. Preferred compositions comprise 65 to 75% by mass gallium and 20 to 25% indium. Materials such as tin, copper, zinc and bismuth may also be present in small percentages. One such preferred composition comprises 66% gallium, 20% indium, 11% tin, 1% copper, 1% zinc and 1% bismuth. Some examples of the commercially available GaIn alloys include galistan—a concoction popular as a substitute for mercury (Hg) in medical applications, and newmerc. The various properties of Ga—In alloy make it desirable liquid metal for use in heat spreaders. The Ga—In alloy spans a wide range of temperature with high thermal and electrical conductivities. It has melting points ranging from −15° C. to 30° C. and does not form vapor at least up to 2000° C. It is not toxic and is relatively cheap. It easily forms alloys with aluminum and copper. It is inert to polyimides, polycarbonates, glass, alumina, Teflon, and conducting metals such as tungsten, molybdenum, and nickel (thereby making these materials suitable for construction of tubes).

However, it is apparent to one skilled in the art that a number of other liquid metals may be used without departing from the scope of the invention. For example, liquid metals having high thermal conductivity, high electrical conductivity and high volumetric heat capacity can also be used. Some examples of liquid metals that can be used in an embodiment of the invention include mercury, gallium, sodium potassium eutectic alloy (78% sodium, 22% potassium by mass), bismuth tin alloy (58% bismuth, 42% tin by mass), bismuth lead alloy (55% bismuth, 45% lead) etc. Bismuth based alloys are generally used at high temperatures (40 to 140° C.). Pure indium can be used at temperatures above 156° C. (i.e., the melting point of indium).

Figure 8:
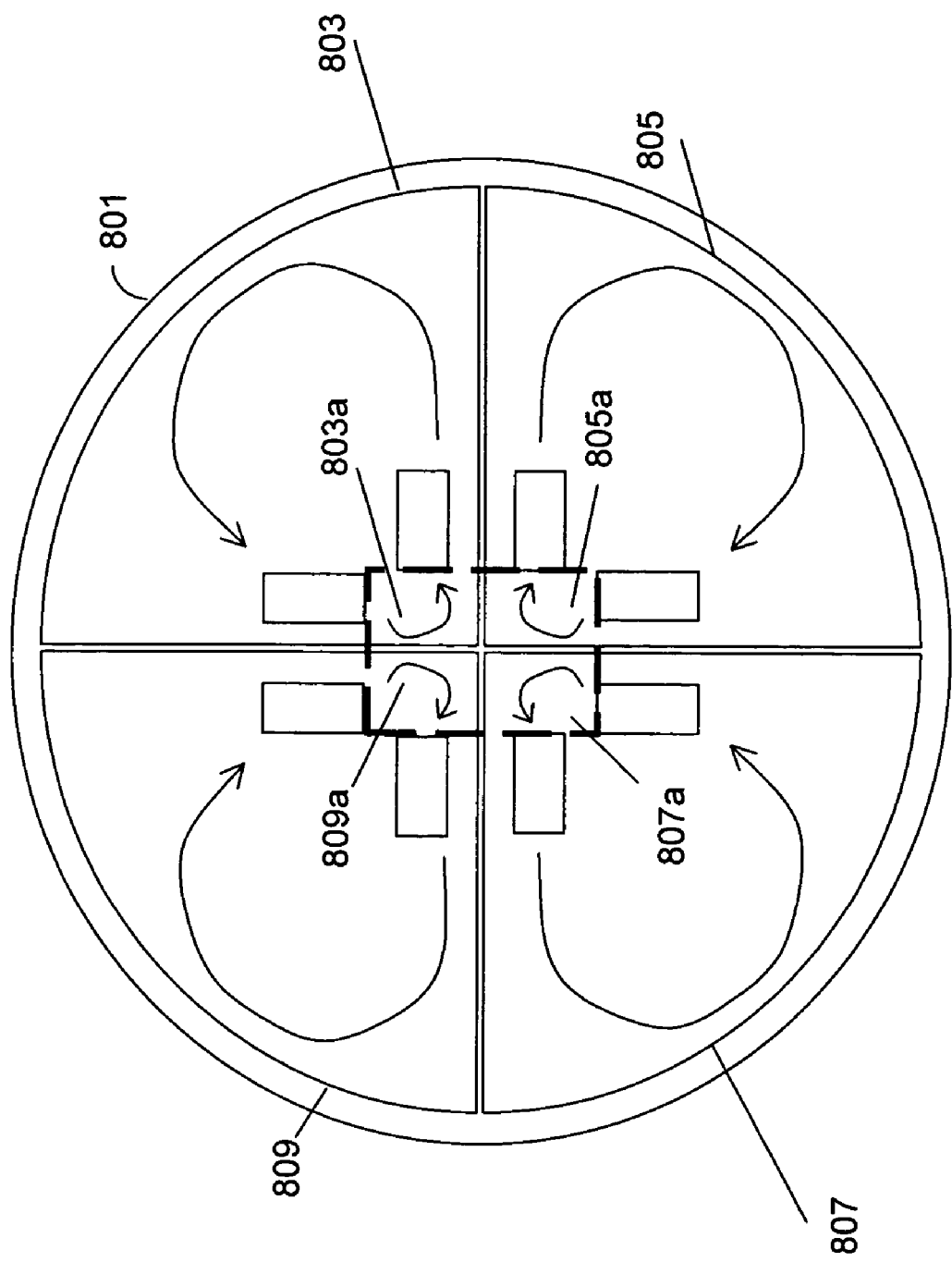
FIG. 8 shows a heat spreader with a circular cross section in accordance with an alternate embodiment of the present invention.
Figure 9:
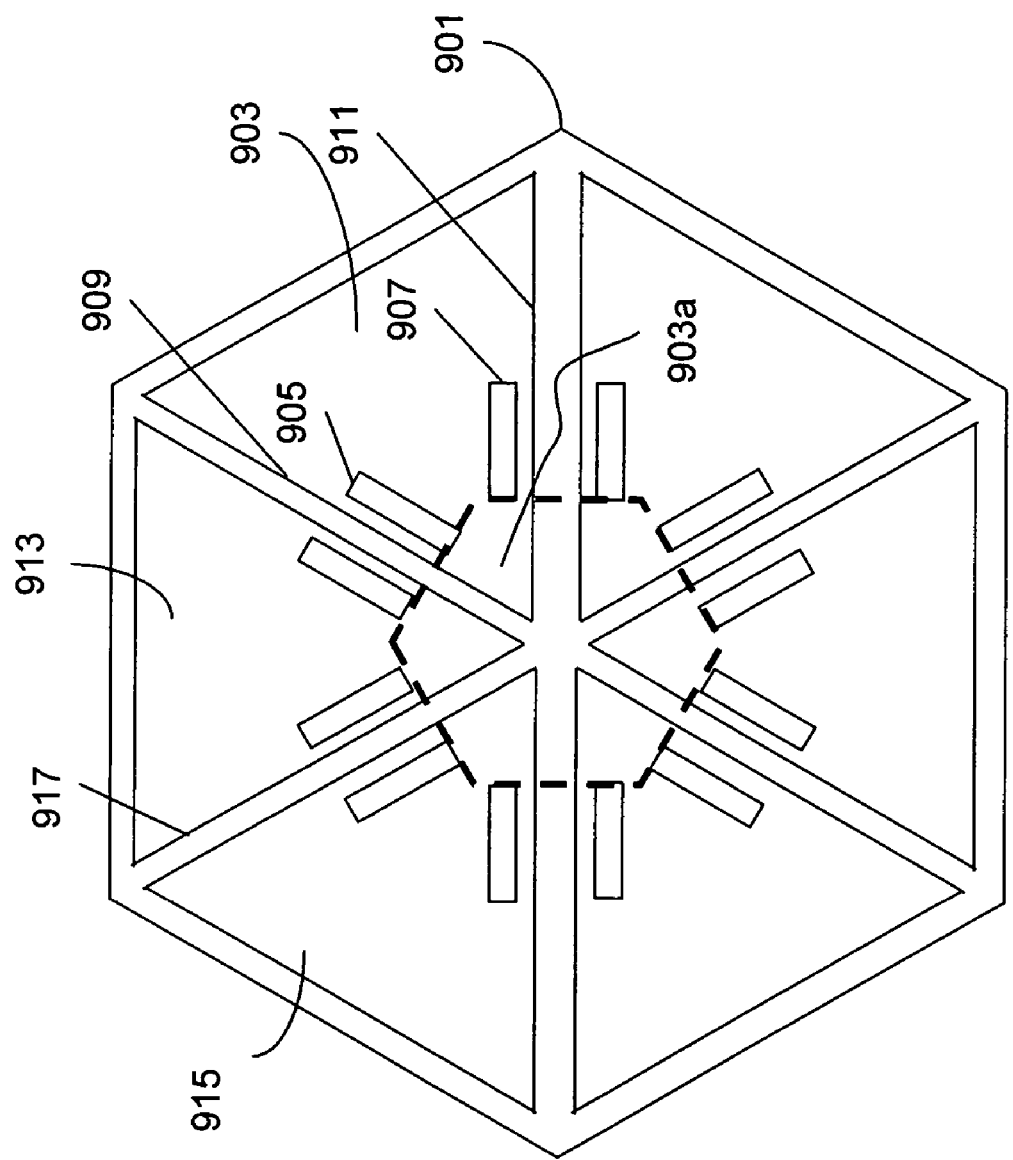
FIG. 9 shows a heat spreader with a hexagonal cross section in accordance with another alternate embodiment of the present invention.

There is a great deal of flexibility inherent in the design of heat spreaders provided by the invention. For example, the cross section of the heat spreader need not be a square. A variety of cross-sections of the heat spreader are possible depending on the requirements. FIG. 8 shows a heat spreader 801 that has a circular cross section. Heat spreader 801 is divided into four chambers 803, 805, 807 and 809. The chambers are in the form of quadrants of a circle. The electromagnetic pumps are configured in a similar manner as shown in FIG. 6. The hot liquid from region 803a is pushed outside and circulated in form of a closed loop spreading the heat uniformly throughout chamber 803. FIG. 9 shows another heat spreader 901 that has a hexagonal cross-section. The chambers are in the form of triangles, each chamber subtending an angle of 60° at the center. Chamber 903 has two electromagnetic pumps 905 and 907 located parallel to two sides 909 and 911 of chamber 903. The electromagnetic pumps circulate liquid metal in chamber 903. In a similar manner, liquid metal in each of the chambers is circulated distributing the heat uniformly throughout heat spreader 903. It is not necessary to have two pumps per chamber in order to circulate liquid metal in the chamber. For example, only one pump (aligned along side 909) may be provided for pushing liquid metal out of hot regions 903a and 913a from chambers 903 and chamber 913 respectively. This is because the direction of force to be applied on liquid metal remains the same in both the chambers. Similarly, a single pump (aligned along side 917) may be provided for collecting the circulated liquid in chambers 913 and 915. Thus, the number of electromagnetic pumps provided in a given heat spreader may vary depending on the specifications of the heat spreader or the electromagnetic pump.

A number of different sizes of heat spreaders may also be provided depending on the size of high power density device. In case the high power density device is a microelectronic chip or an array of chips, the heat spreader may be small (say, having dimensions of the order of millimeters). In case the high power density device is a chemical/nuclear reactor a bigger heat spreader may be provided.

Figure 10:
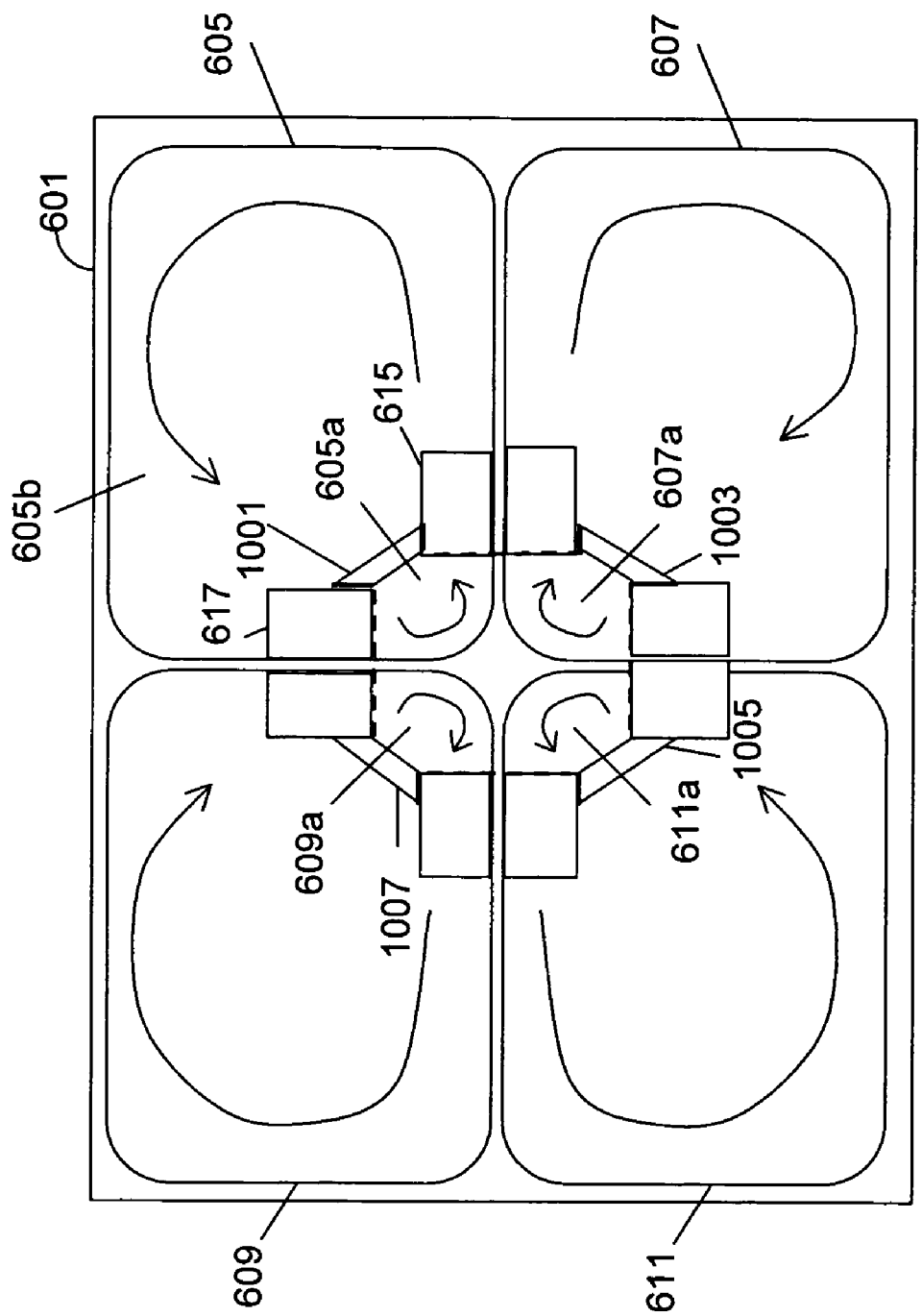
FIG. 10 shows a heat spreader that has thermoelectric generators for powering electromagnetic pumps in accordance with another alternate embodiment of the present invention.

FIG. 10 shows an alternate embodiment of the invention. In this embodiment, heat spreader 601 is provided with four thermoelectric generators 1001, 1003, 1005 and 1007. Thermoelectric generator 1001 is positioned such that one end of thermoelectric generator 1001 is in contact with liquid metal in region 605a while the other end is in contact with relatively cooler liquid metal in region 605b. Thus, there exists a temperature difference between the two ends of the thermoelectric generator 1001. Thermoelectric generator 1001 utilizes this temperature difference to generate power. This power is then utilized for operating electromagnetic pumps 615 and 617.

Thermoelectric generator 1001 is comprised of series of p type semiconductor members and n type semiconductor members sandwiched between thermally-conducting, electrically-insulating substrates such as oxide-coated silicon wafers, aluminum nitride (AlN) and other thin ceramic wafers. Thermoelectric generator 1001 utilizes the "Seebeck effect" to convert the temperature difference between the hot region 605a and the cold region 605b of heat spreader 601 to electrical energy in the form of a potential difference. The voltage generated by thermoelectric generator 1001 depends on a temperature difference between the regions 605a and 605b. Alloys of bismuth (Bi), tellurium (Te), antimony (Sb) and selenium (Se) are the most commonly used materials for manufacturing the semiconductor members of thermoelectric generator 1001 for devices operating near room temperature.

The use of thermoelectric generators in heat spreader provides sufficient power to drive the electromagnetic pumps. This may be illustrated using the following representative example:

The coefficient of performance of a thermoelectric generator i.e. the ratio of electrical power to the heat flow into the hot end, is roughly:

$$\eta = \epsilon (\Delta T / T_h)$$

where $\epsilon$ is the thermodynamic conversion efficiency, $\Delta T$ is the temperature differential between the hot and cold ends, and $T_h$ is the temperature of the hot end. The value of $\epsilon$ is 0.1 for conventional Bi/Sb/Te/Se alloys and Pb/Te/Se alloy materials. The typical temperature differential across the two ends of thermoelectric generator would be around 15–40K (i.e., 15–40 Kelvin). Assuming $\Delta T=30$ K and $T_h=358$ K (i.e., 85° C.) the coefficient of performance $\eta$ of the thermoelectric generator comes out to be 0.0084. If the high power density device dissipates 100W, the electrical power generated by the thermoelectric generator will be 0.84 W, which is sufficient for driving the electromagnetic pump. Of course, better thermoelectric generators can easily double the performance.

Figure 11:
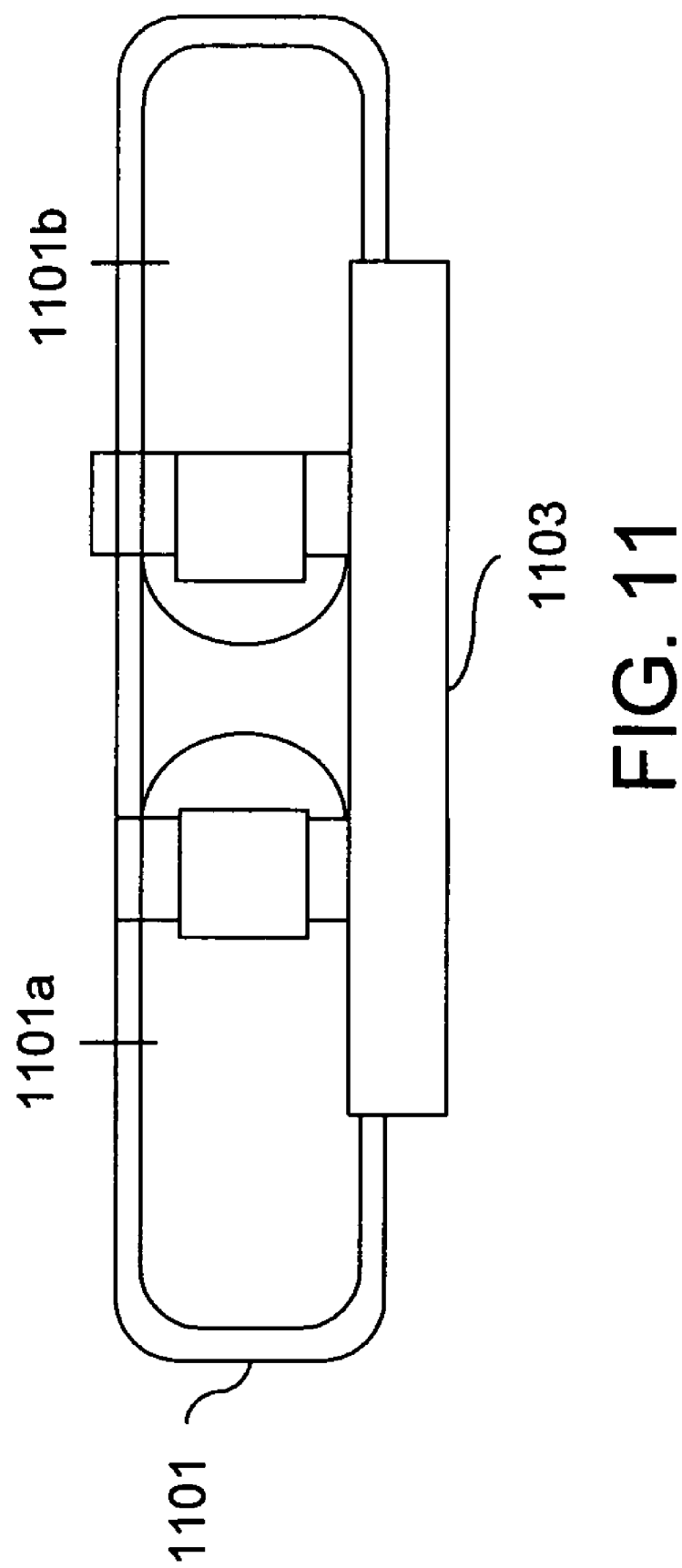
FIG. 11 shows a heat spreader sealed with a high power density device so as to allow direct contact of liquid metal with high power density device.

FIG. 11 shows another embodiment of the invention. A heat spreader 1101 is shown sealed over a high power density device 1103. Heat spreader 1101 comprises four chambers, two of which 1101a and 1101b are shown. The chambers of heat spreader 1101 are sealed with high power density device 1103 such that liquid metal comes in direct contact with high power density device 1103. This direct contact increases the efficiency of heat transfer since there is no interface between high power density device 1103 and the liquid metal. The material of the surface of high power density device 1103, which comes in direct contact with the liquid metal should be such that it is not corroded by the liquid metal. Exemplary materials for such a surface include copper plated with nickel, silicon dioxide and silicon coated with silicon nitride etc.

Heat spreader 1101 may be sealed in a number of ways depending on the nature of high power density device 1103 to be cooled. A seal may be made using an interference fit between heat spreader 1101 and high power density device 1103. A seal may also be made using compressed o-rings or similar compression seals. The o-rings may be made of materials such as Teflon™, Buna-n, and Viton™. Addition of a bonding agent or a sealant, such as epoxy, may also be used to seal heat spreader 1101. Heat spreader 1101 may also be soldered or welded onto high power density device 1103.

It will be apparent to those skilled in the art, that heat spreader 1101 is similar in all other aspects to heat spreader 601, which was described in conjunction with FIG. 6.

Figure 12:
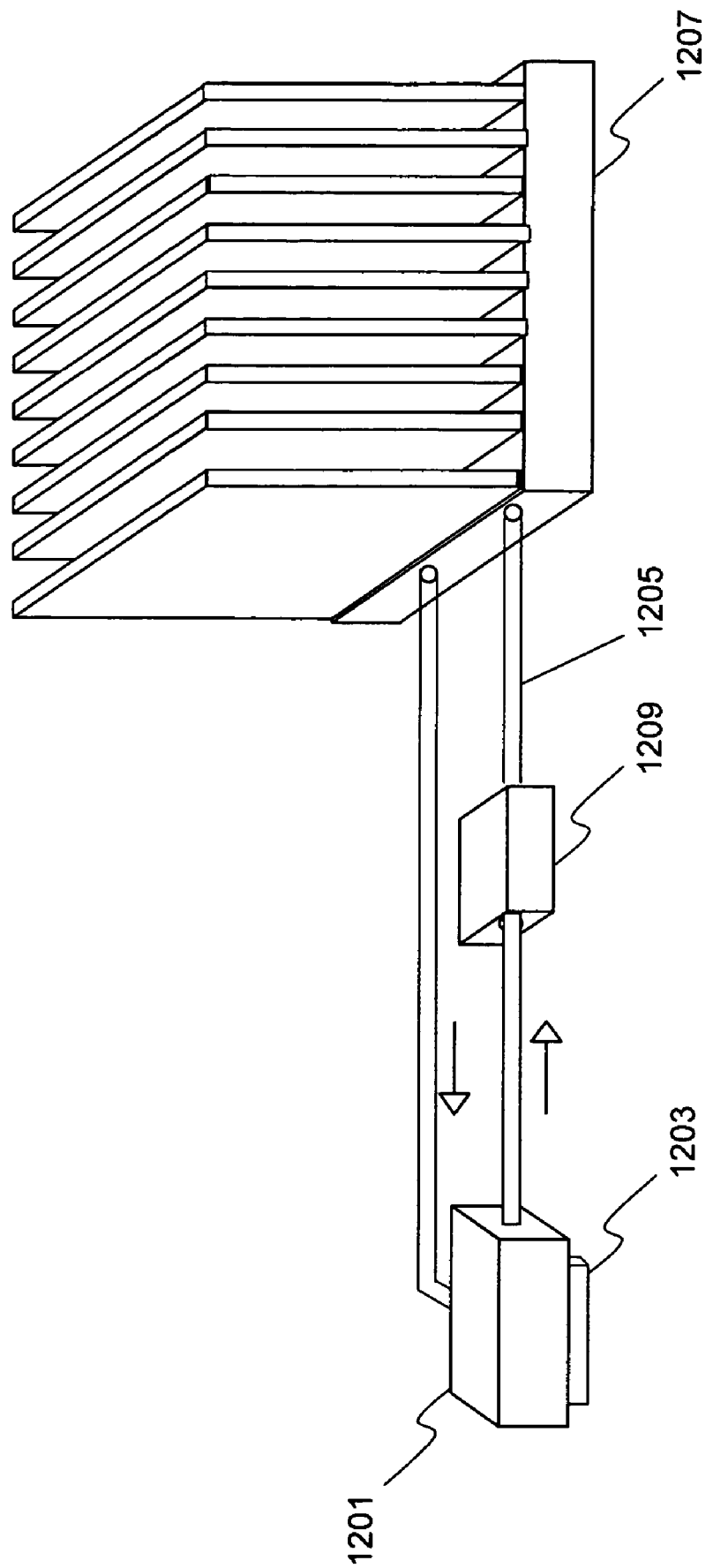
FIG. 12 shows a heat spreader connected to a liquid metal conduit for effectively dissipating heat from a high power density device at a distance in accordance a preferred embodiment of the invention.

In accordance with yet another embodiment of the invention, the invention provides a system for spreading heat from a high power density device. This embodiment is shown in FIG. 12. A heat spreader 1201 is shown placed next to a high power density device 1203. Heat spreader 1201 contains liquid metal which absorbs heat from high power density device 1203. Liquid metal spreads heat within the heat spreader 1201. A portion of the liquid metal exits heat spreader 1201 and enters conduit 1205. Conduit 1205 carries heated liquid metal to heat sink 1207. An electromagnetic pump 1209 pumps the liquid metal in conduit 1205. In heat sink 1207, heat from the heated liquid metal is dissipated to the atmosphere. The distance of heat sink 1207 from high power density device 1203 is determined based on the form factor (the configuration and physical arrangement of the various components in and around the high power density device 1203). Thus, the system provides for heat dissipation in the cases where dissipating heat in the proximity of high power density device 1203 is not desirable. For example, in a computer, in case the heat dissipated by components such as the microprocessor or the power unit is in proximity of components like memory, this heat may lead to permanent loss of data from memory. Thus it is desirable that the heat generated by the microprocessor/power unit is dissipated at a position away from components that may get damaged.

After rejecting heat through heat sink 1207, the cooled liquid metal is returned to heat spreader 1203 through conduit 1205.

Figure 13:
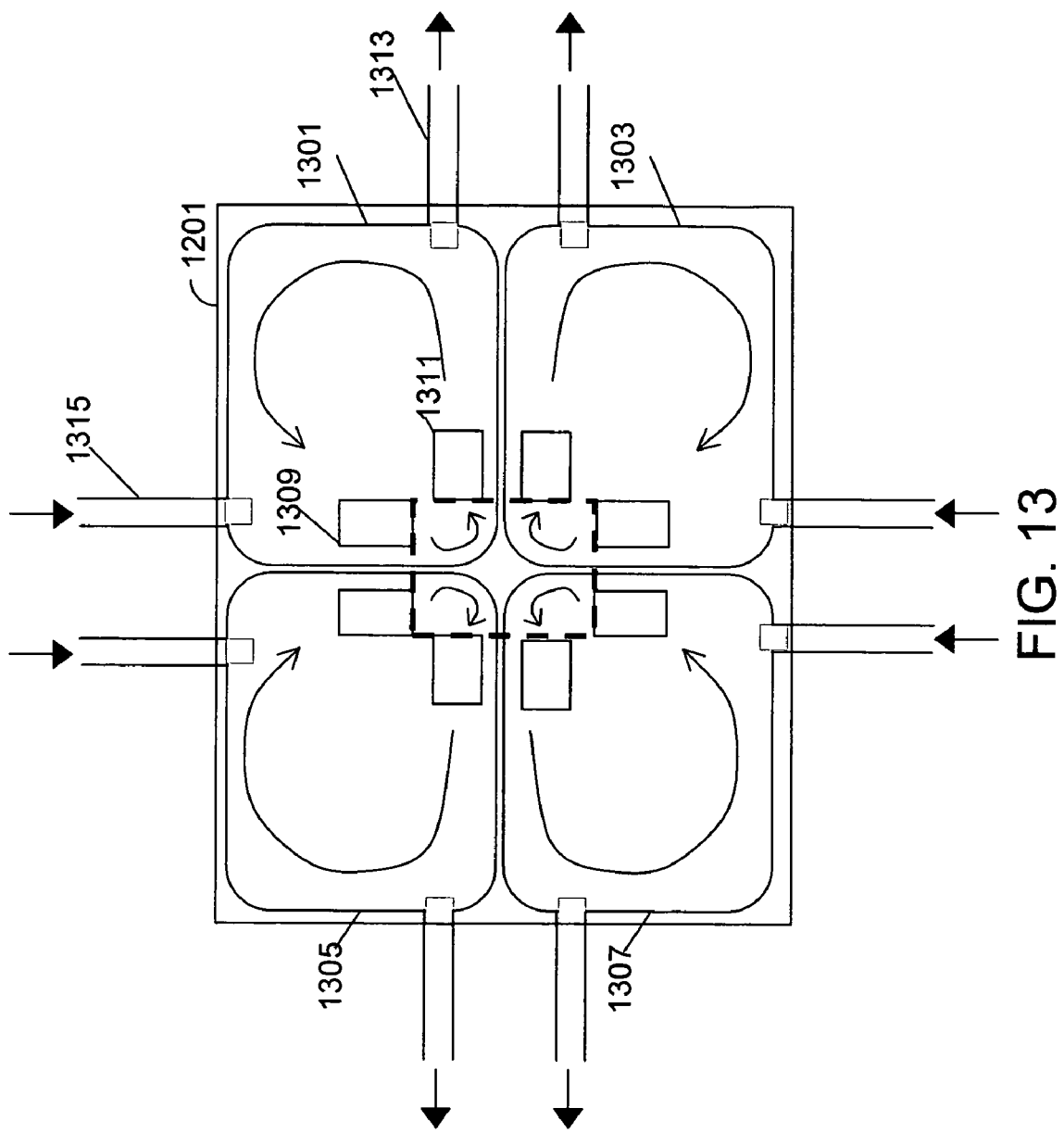
FIG. 13 shows the top view of the heat spreader shown in FIG. 12.

Referring to FIG. 13, heat spreader 1201 is similar to heat spreader 601 described in conjunction with FIG. 6. It comprises four chambers 1301, 1303, 1305 and 1307. A plurality of electromagnetic pumps circulate liquid metal within heat spreader 1201. For example, electromagnetic pumps 1309 and 1311 circulate liquid metal within chamber 1301. Heat spreader 1201 is different from heat spreader 601, as heat spreader 1201 further comprises at least one inlet and one outlet. In the embodiment shown in FIG. 13, heat spreader 1201 comprises four inlets and four outlets. A pair of inlet and outlet corresponds to each chamber in heat spreader 1201. The outlets carry away a portion of heated liquid metal away from the chambers while the inlets bring cooled liquid metal (after rejecting heat away from the heat spreader) back to the chambers. For example, outlet 1313 carries liquid metal away from chamber 1301. This liquid metal combines with liquid metal from other chambers and enters conduit 1205 (not shown in the figure). After rejecting heat at heat sink 1207, the liquid metal in conduit 1205 is distributed and enters the chambers in heat spreader 1201 through the inlets. For example, the liquid metal enters chamber 1301 through inlet 1315. In an alternate embodiment the single conduit may be replaced by multiple conduits, each conduit connected to the one or more outlets to take away the heated liquid metal. In this embodiment, the conduits dissipate heat at a heat sink away from the heat spreader and bring back the cooled liquid metal to the chambers through multiple inlets.

Figure 14:
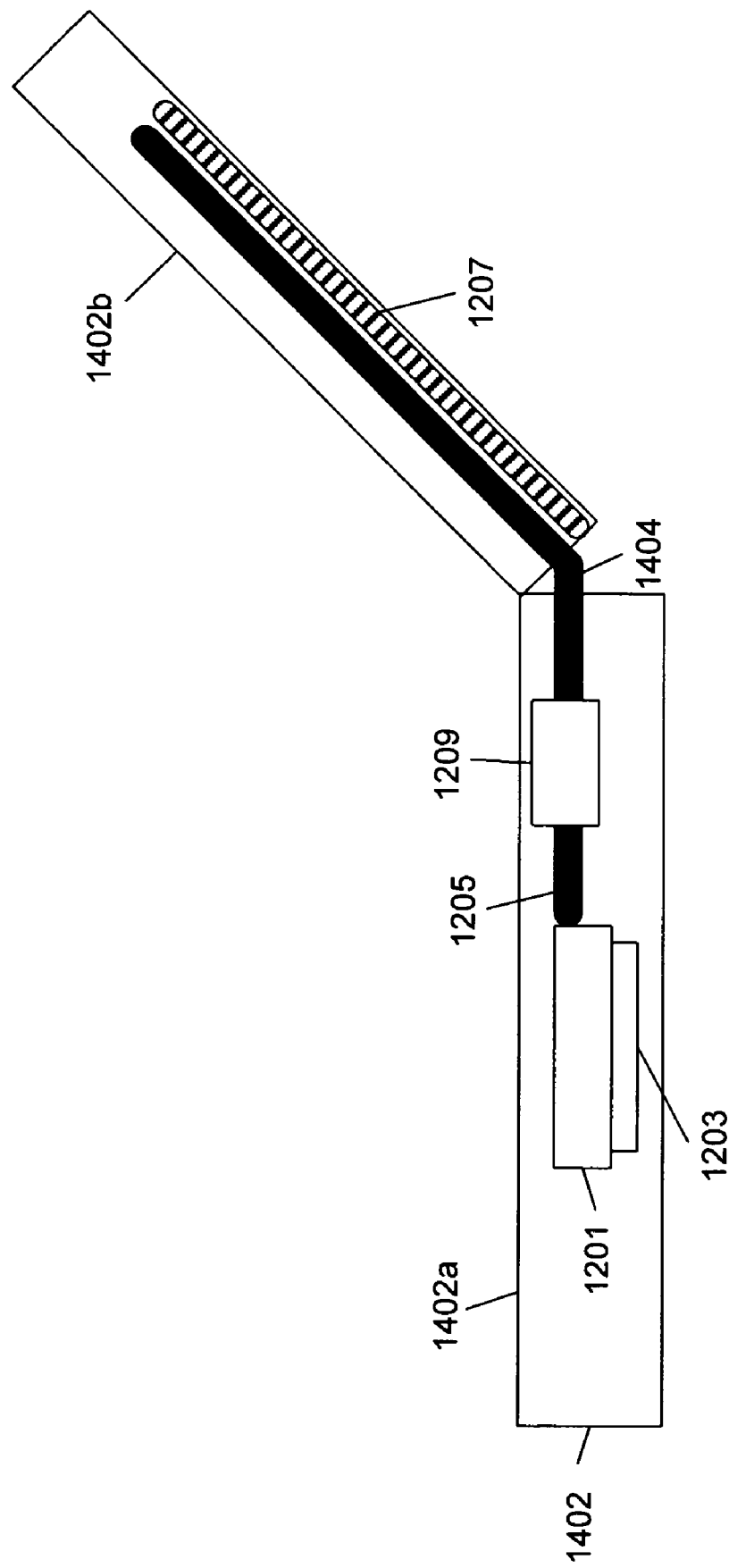
FIG. 14 shows a system for dissipating heat from a high power density device in a folding microelectronic device using flexible conduits in accordance with another embodiment of the invention.

In accordance with another embodiment, the present invention provides a system for dissipating heat from a high power density device in a folding microelectronic device. This embodiment is shown in FIG. 14. Examples of folding microelectronic device include a notebook computer, a personal digital assistant (PDA), a tablet PC or a mobile phone. As shown in FIG. 14, a folding microelectronic device 1402 comprises a base member 1402*a* and a folding member 1402*b*. Base member 1402*a* contains at least one high power density device 1203. For example, in a laptop, base member 1402*a* contains a processor, a graphics card and other such high power density devices.

The system comprises heat spreader 1201, conduit 1205, at least one electromagnetic pump 1209 and heat sink 1207. Heat spreader 1201 is filled with liquid metal that absorbs heat from high power density device 1203. Conduit 1205 passes through heat spreader 1201 and carries the heated liquid metal away. The liquid metal is pumped by at least one electromagnetic pump 1209.

Conduit 1205 comprises a portion 1404 that carries the heated liquid metal from base member 1402*a* across the bend of folding microelectronic device 1402 to folding member 1402*b*. Further, portion 1404 allows folding member 1402*b* to bend with respect to base member 1402*a*. Portion 1404 is made of a flexible material that is inert to liquid metal. Exemplary materials include rubber, elastomer and Teflon™. Alternatively, entire conduit 1205 is made of the flexible material such that there is no need of the flexible portion.

Conduit 1205 carries the liquid metal into folding member 1402*b* of folding microelectronic device 1402. Heat from the liquid metal in conduit 1205 is transferred to heat sink 1207, which is located in folding member 1402*b*. Heat sink 1207 then releases the heat to the atmosphere. After transferring heat to heat sink 1207, the liquid metal returns to base member 1402*a* through conduit 1205 to complete the closed loop.

Figure 15:
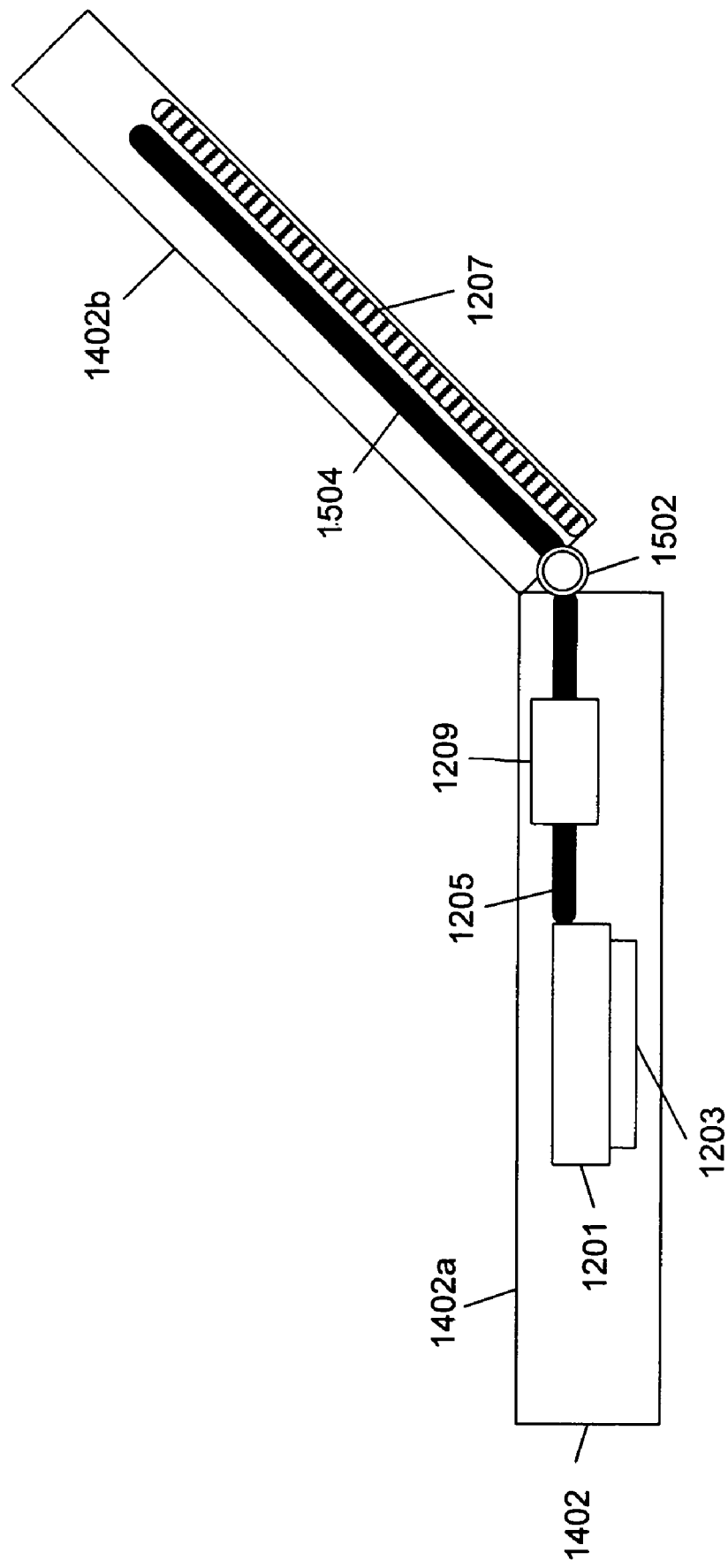
FIG. 15 shows a system for dissipating heat from a high power density device in a folding microelectronic device using a hinge with an integrated conduit in accordance with another embodiment of the invention.

Another embodiment of the invention for dissipating heat from a high power density device in a folding microelectronic device is shown in FIG. 15. The system comprises a hinge with an integrated conduit that allows heated liquid metal to flow from the base member to the folding member of a folding microelectronic device, while allowing the folding member to bend with respect to the base member.

FIG. 15 shows heat spreader 1201 filled with liquid metal. The liquid metal absorbs heat from high power density device 1203. Conduit 1205 carries the heated liquid metal away from heat spreader 1201. The liquid metal is pumped by at least one electromagnetic pump 1209. Further, conduit 1205 attaches to a hinge 1502. Hinge 1502 has an integrated conduit and allows the bending of folding member 1402*b* with respect to base member 1402*a*. Hinge 1502 allows the liquid metal to flow through it and enter folding member 1402*b* through a second conduit 1504. Hinge 1502 is made from materials that provide the mechanical rigidity required for bending of folding member 1402*b* and are inert to the liquid metal. Examples of such materials include Teflon™, thermoplastics and metals such as copper, stainless steel and nickel. Alternatively, hinge 1502 may be made of any other metal that is coated with a coating that is chemically resistant to the liquid metal.

Further, in folding member 1402*b*, the liquid metal transfers heat to heat sink 1207, which rejects heat to the atmosphere. Cold liquid metal returns to hinge 1502 and flows through it to reach base member 1402*a* through conduit 1205. Further, the liquid metal flows to heat spreader 1201, hence completing a closed loop.

Figure 16:
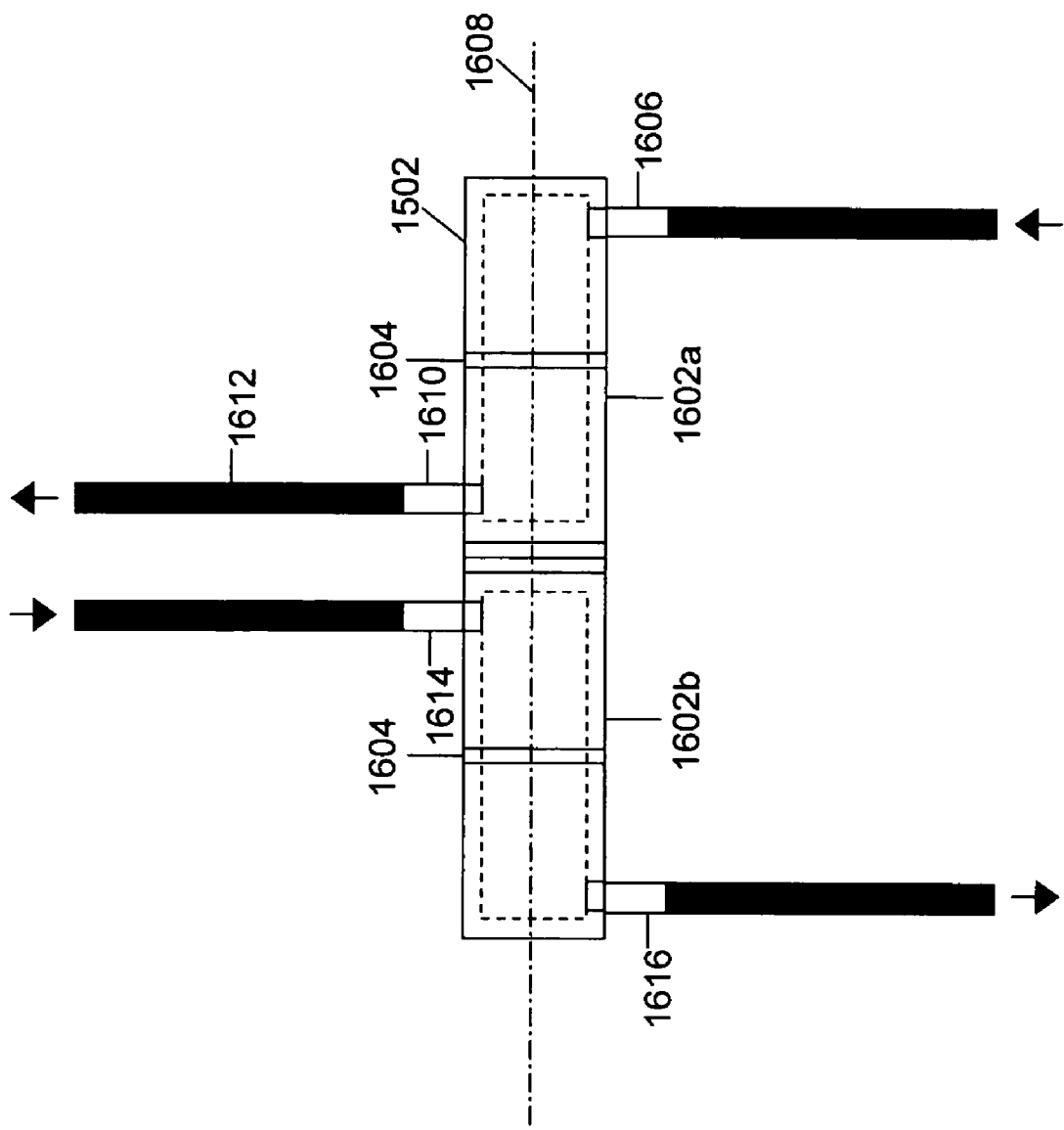
FIG. 16 shows the structure of the hinge shown in FIG. 15.

Referring to FIG. 16, hinge 1502 comprises portions 1602*a* and 1602*b*. Each of the portions 1602*a* and 1602*b* comprise a seal 1604 that allows hinge 1502 to rotate while preventing liquid metal from leaking. The seal may be formed by compressive contact between members 1602*a* and 1602*b*. It could also be formed using rotary joints with o-rings acting as seals. The o-rings may be made of materials such as Teflon™, Buna-n, and Viton™. Liquid metal enters hinge 1502 through a port 1606 on portion 1602*a*. Thereafter, it flows along axis of rotation 1608 of hinge 1502. Further, liquid metal leaves hinge 1502 through a port 1610 and enters conduit 1612. After rejecting heat to heat sink 1410, the liquid metal then returns to hinge 1502 through a port 1614 on portion 1602*b*. The liquid metal leaves hinge 1502 through port 1616 and returns to conduit 1406. Conduit 1406 takes liquid metal back to heat spreader 1201.

It will be apparent to those skilled in the art that portions 1602*a* and 1602*b* may also be implemented as separate hinges in microelectronic device 1402.

The arrangement described with respect to FIG. 15 and FIG. 16 can also be used to distribute the hot liquid metal into a plurality of conduits in folding member 1402*b*. The distribution of liquid metal into conduits helps in spreading the heat for better heat dissipation. The various conduits carry the liquid metal into a plurality of heat sinks in folding member 1402b. This requires that portion 1602a of hinge 1502 have a plurality of outlet ports that distribute the liquid metal into the plurality of conduits in folding member 1402b. After rejecting heat through heat sink 1410, cooled liquid metal collects and enters hinge 1502 through port 1616 and returns to base member 1402a.

Further, the embodiment described with respect to FIG. 15 and FIG. 16 does not require the conduit to be flexible. Hence, the system is more reliable and the wear and tear of the conduit is reduced.

The embodiments described with the help of FIG. 14 and FIG. 15 allow the dissipation of heat from folding member 1402b of microelectronic device 1402. For example, heat is transferred from the base member of a laptop to the folding member of a laptop. The folding member offers more space for incorporating a heat sink. Further, other components in the base member, such as memory and storage are protected from the heat.

Figure 17:
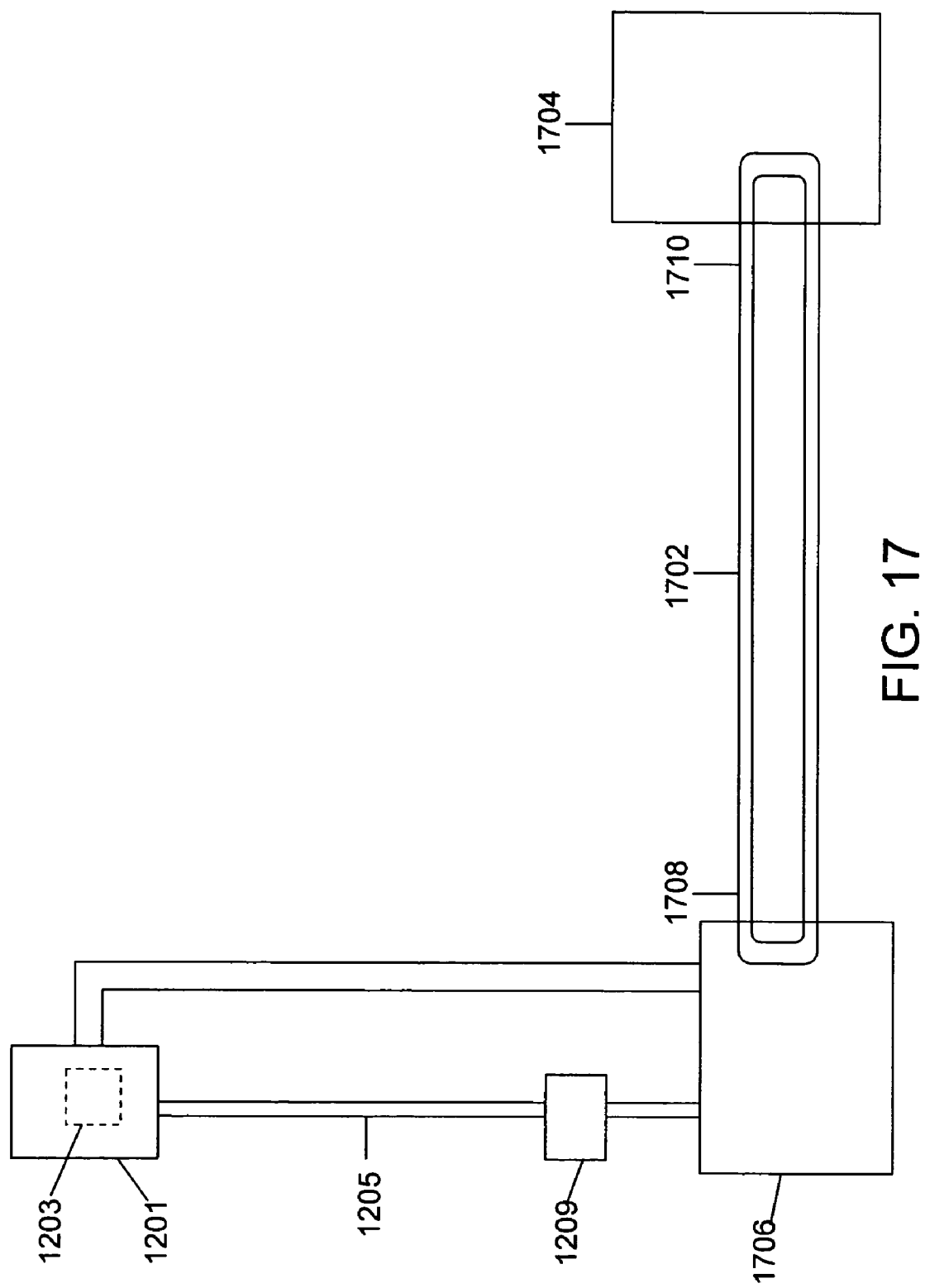
FIG. 17 shows a system for dissipating heat from a high power density device that uses a liquid metal system and a heat pipe, in accordance with another embodiment of the invention.

FIG. 17 shows yet another embodiment of the invention. FIG. 17 shows a system for dissipating heat from a high power density device 1203. The system comprises heat spreader 1201, conduit 1205, at least one electromagnetic pump 1209, a heat pipe 1702, a heat sink 1704 and a liquid-heat pipe heat exchanger 1706. Liquid metal in heat spreader 1201 absorbs heat from high power density device 1203. The liquid metal flows through conduit 1205. Electromagnetic pump 1209 pumps the liquid metal in conduit 1205. In liquid-heat pipe heat exchanger 1706, heat from the liquid metal is transferred to heat pipe 1702. The cold liquid metal returns to heat spreader 1201 to complete the closed loop.

Heat pipe 1702 consists of a sealed metal tubular container whose inner surfaces may also include a capillary wicking material. A fluid flows along the wick structure of the heat pipe. Liquid at end 1708 absorbs the heat, evaporates and moves to a cold end 1710 of the heat pipe. Exemplary liquids that could be used in heat pipe 1702 include water and various chlorofluorocarbons. The evaporated vapor comes in contact of cold end 1710, condenses and dissipates heat. Heat is transferred to heat sink 1704. The condensed liquid moves back to end 1708 by gravitation or by capillary action of the inner surface. Heat sink 1704 rejects the heat to the atmosphere.

As will be apparent to those skilled in the art, the system as described in FIG. 17 may be used with the flexible conduit as shown in FIG. 14 or the hinge with the integrated conduit as shown in FIG. 15. In such a system, the liquid metal system (comprising a heat spreader, a conduit and a pump) carries heat from a high power density device across a bend in a microelectronic device. In the folding member of the microelectronic device, heat is transferred to at least one heat pipe with the help of a liquid-heat pipe heat exchanger. The heat pipe then carries the heat and dissipates the heat to the atmosphere through a heat sink.

Figure 18:
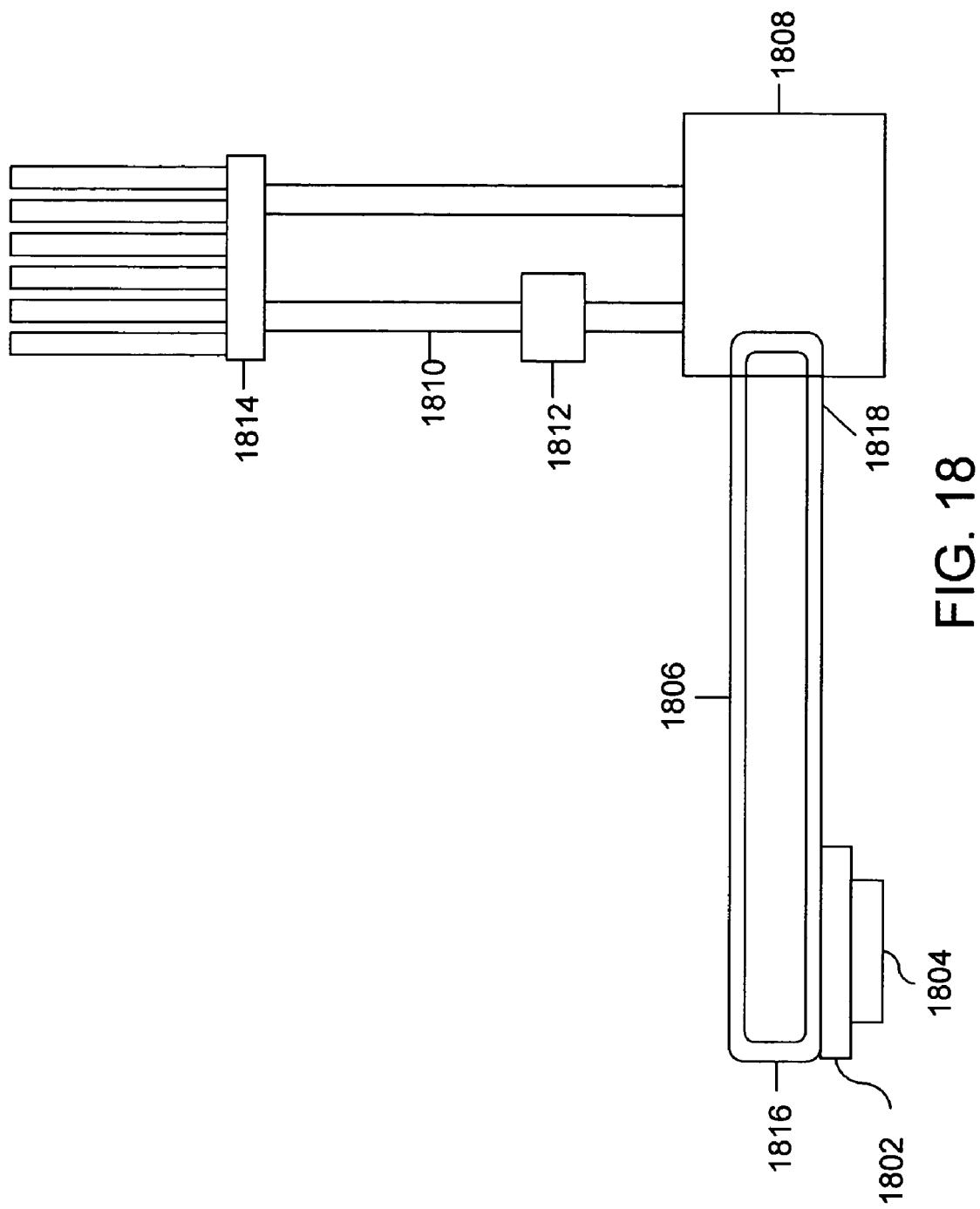
FIG. 18 shows another embodiment of a system for dissipating heat from a high power density device using a liquid metal system and a heat pipe, in accordance with yet another embodiment of the invention.

Yet another embodiment of the invention is shown in FIG. 18. The system shown in FIG. 18 comprises a heat spreader 1802 positioned next to a high power density device 1804, a heat pipe 1806, a liquid-heat pipe heat exchanger 1808, a conduit 1810, at least one electromagnetic pump 1812 and a heat sink 1814. Heat spreader 1802 ensures uniform heat transfer between high power density device 1804 and heat pipe 1806. Liquid at hot end 1816 of heat pipe 1806 absorbs heat from high power density device 1804 through heat spreader 1802, evaporates and moves through heat pipe 1806 to cold end 1818. Cold end 1818 is in direct contact with liquid metal in liquid-heat pipe heat exchanger 1808. The evaporated vapor rejects heat to the liquid metal, condenses and moves back to hot end 1816 by gravitation or capillary action of the inner lining of heat pipe 1806.

Heated liquid metal in liquid-heat pipe heat exchanger 1808 is carried away by conduit 1810. Electromagnetic pump 1812 pumps the liquid metal through conduit 1810. The liquid metal transfers heat to heat sink 1814. Heat sink 1814 rejects the heat to the atmosphere. Cooled liquid metal returns to liquid-heat pipe heat exchanger 1808 through conduit 1810, hence forming a closed loop.

The system of liquid metal and heat pipe described above may be used for effective heat dissipation over large distances without requiring a large amount of liquid metal. This reduces the overall weight and the cost of the heat dissipation system.

In another embodiment of the system described in conjunction with FIG. 18, heat pipe 1806 is directly connected to heat sink 1814. Heat pipe directly rejects heat to heat sink 1814, which rejects heat to the atmosphere. This embodiment does not require a separate liquid metal system comprising liquid-heat pipe heat exchanger 1808, conduit 1810 and electromagnetic pump 1812, hence reducing the total amount of liquid metal required in the system. This reduces the weight and the cost of the system.

The use of liquid metal circulation in heat spreaders offers many advantages over conventional heat spreaders. First, the circulation of liquid metal in heat spreader takes advantage of both conduction and convection as liquid metal is a good conductor of heat. This is unlike heat spreaders made of copper or aluminum that spread heat by conduction only. Use of circulating liquid metal has an advantage over circulating water as water, being a poor conductor of heat, can spread heat by convection only. Second, in heat spreaders using liquid metals, maximum heat transfer is not limited by vapor/liquid nucleation properties unlike heat spreaders based on vapor chambers. Also, interface resistance between liquid metal and heat spreader surface is comparatively low in liquid metal-based heat spreaders. Third, liquid metals can be pumped by electromagnetic pump that has no moving mechanical parts. Electromagnetic pumps are reliable, have no noise or vibration and occupy very small volume. Fourth, thermoelectric generators may be employed to power the electromagnetic pumps thereby providing heat spreaders that do not require any external sources to power the electromagnetic pumps.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A heat spreader for spreading heat generated by high power density devices, the heat spreader comprising:
   a. at least one cooling chamber containing liquid metal, the at least one cooling chamber allowing the liquid metal to come in direct contact with the high power density device; and
   b. electromagnetic pump means for circulating the liquid metal in the at least one cooling chamber, the liquid metal circulating in the at least one cooling chamber, the circulation spreading the heat generated by high power density devices over the heat spreader.

2. The heat spreader as recited in claim 1 wherein the liquid metal in the at least one cooling chamber is an alloy of gallium and indium.

3. The heat spreader as recited in claim 1 wherein the liquid metal in the at least one cooling chamber is selected from a group consisting of indium, gallium, mercury bismuth tin alloy, bismuth lead alloy and sodium potassium eutectic alloy.

4. The heat spreader as recited in claim 1 wherein the system further comprises an electromagnetic interference shield.

5. The heat spreader as recited in claim 1 wherein the cross-section of heat spreader is selected from a group consisting of circular, rectangular and hexagonal.

6. The heat spreader as recited in claim 1 wherein the heat spreader has four cooling chambers.

7. The heat spreader as recited in claim 1 wherein the system further comprises a thermoelectric generator for generating power for running the electromagnetic pumps, the thermoelectric generator utilizing the temperature difference between its ends to generate power.

8. A system for efficiently dissipating heat from a high power density device, the system comprising:
   a. a heat spreader positioned adjacent to the high power density device, the heat spreader comprising:
      i. at least one cooling chamber containing liquid metal;
      ii. at least one outlet carrying liquid metal from the at least one cooling chamber;
      iii. at least one inlet returning liquid metal to the at least one cooling chamber; and
      iv. at least one electromagnetic pump pumping the liquid metal;
   b. means for cooling the liquid metal, the cooling means being placed at a predefined distance away from the heat spreader; and
   c. at least one conduit circulating the liquid metal between the heat spreader and the cooling means, the conduit being connected to the outlet and the inlet, the conduit carrying away the heated liquid metal from the cooling chamber through the outlet to the cooling means and returning the liquid metal to the cooling chamber through the inlet.

9. The system as recited in claim 8 wherein the high power density device is located in a folding microelectronic device.

10. The system as recited in claim 9 wherein the at least one conduit is constructed using a flexible material to allow bending.

11. The system as recited in claim 9 wherein the at least one conduit comprises a flexible portion for transferring the liquid metal across a bend.

12. The system as recited in claim 9 further comprising a hinge, the hinge comprising an integrated conduit, the integrated conduit allowing transfer of the liquid metal across a bend from at least one conduit to at least one other conduit.

13. The system as recited in claim 8 wherein the means for cooling the liquid metal is a heat sink.

14. The system as recited in claim 8 wherein the means for cooling the liquid metal comprises a liquid-heat pipe heat exchanger, a heat pipe and a heat sink.

15. A system for efficiently dissipating heat from a high power density device, the system comprising:
   a. a heat spreader positioned adjacent to the high power density device, the heat spreader comprising:
      i. at least one cooling chamber containing liquid metal; and
      ii. at least one electromagnetic pump arranged so as to circulate the liquid metal in the at least one cooling chamber;
   b. a heat pipe absorbing heat from the heat spreader; and
   c. means for cooling the heat pipe, the cooling means being placed at a predefined distance away from the heat spreader.

16. The system as recited in claim 15 wherein the means for cooling the heat pipe is a heat sink.

17. The system as recited in claim 15 wherein the means for cooling the heat pipe comprises a liquid-heat pipe heat exchanger, a conduit and a heat sink.

* * * * *

UNITED STATES PATENT AND TRADEMARK OFFICE
CERTIFICATE OF CORRECTION

PATENT NO. : 7,131,286 B2  Page 1 of 1
APPLICATION NO. : 10/768767
DATED : November 7, 2006
INVENTOR(S) : Uttam Ghoshal and Andrew Carl Miner It is certified that error appears in the above-identified patent and that said Letters Patent is hereby corrected as shown below:

Title Page: (*) Notice: Please add, -- (*) Notice: This patent is subject to two terminal disclaimers.--

Title Page, Item (56), for Pat. Doc., page 2, col. 2, line 2, please replace "JP 06188682 A" with -- JP 06188582 A --

Col. 2, line 37, please replace "Head" with -- Heat --

Signed and Sealed this

Twenty-first Day of August, 2007

JON W. DUDAS
*Director of the United States Patent and Trademark Office*